US012763118B2

(12) United States Patent
Lee

(10) Patent No.: US 12,763,118 B2
(45) Date of Patent: Oct. 13, 2026

(54) NONVOLATILE MEMORY INTERFACE CIRCUIT, STORAGE DEVICE HAVING THE SAME AND METHOD OF OPERATING THE SAME

(71) Applicant: SAMSUNG ELECTRONICS CO., LTD., Suwon-si (KR)

(72) Inventor: Choongeui Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 18/758,015

(22) Filed: Jun. 28, 2024

(65) Prior Publication Data

US 2025/0201287 A1 Jun. 19, 2025

(30) Foreign Application Priority Data

Dec. 14, 2023 (KR) ........................ 10-2023-0182067

(51) Int. Cl.
*G11C 7/22* (2006.01)
*G06F 3/06* (2006.01)
*G11C 7/10* (2006.01)

(52) U.S. Cl.
CPC .............. *G11C 7/222* (2013.01); *G06F 3/061* (2013.01); *G06F 3/0655* (2013.01); *G06F 3/0679* (2013.01); *G11C 7/1069* (2013.01); *G11C 7/1096* (2013.01)

(58) Field of Classification Search
CPC ..... G11C 7/222; G11C 7/1069; G11C 7/1096; G06F 3/061; G06F 3/0655; G06F 3/0679
USPC .......................................................... 365/193
See application file for complete search history.

(56) References Cited

U.S. PATENT DOCUMENTS 7,323,903 B1 * 1/2008 Lee .................... H03K 19/1776 365/232
8,565,034 B1 * 10/2013 Lu ............................ G11C 7/22 365/194
10,026,502 B2 7/2018 Hashimoto
11,756,599 B2 9/2023 Hwang
2012/0239960 A1 9/2012 Priel et al.
2013/0272454 A1 10/2013 Watanabe et al.
2017/0287539 A1 10/2017 Mozak
2023/0267978 A1 8/2023 Yasuda

FOREIGN PATENT DOCUMENTS

KR 10-1876619 B1 7/2018

* cited by examiner

*Primary Examiner* — Amir Zarabian
*Assistant Examiner* — Daniel John King
(74) *Attorney, Agent, or Firm* — Morgan, Lewis & Bockius LLP

(57) ABSTRACT

A storage device includes at least one nonvolatile memory device, and a controller configured to control the at least one nonvolatile memory device, wherein the controller includes a nonvolatile memory interface circuit configured to communicate with the at least one nonvolatile memory device through at least one channel, wherein the nonvolatile memory interface circuit includes a margin collector configured to collect margin information by comparing read data with sampling data, an on-chip margin search logic configured to track a valid window margin by adjusting an offset value based on the margin information, and a compensation calculator configured to determine off-chip variation corresponding to the offset value when the valid window margin is in a margin lock state.

20 Claims, 18 Drawing Sheets

NONVOLATILE MEMORY INTERFACE CIRCUIT, STORAGE DEVICE HAVING THE SAME AND METHOD OF OPERATING THE SAME

CROSS-REFERENCE TO RELATED APPLICATION

This application claims priority under 35 U.S.C. § 119 to Korean Patent Application No. 10-2023-0182067 filed on Dec. 14, 2023, in the Korean Intellectual Property Office, the disclosure of which is incorporated by reference herein in its entirety.

TECHNICAL FIELD

The present disclosure relates to a nonvolatile memory interface circuit, a storage device having the same and a method of operating the same.

DESCRIPTION OF RELATED ART

A memory device and a memory controller may transmit and receive data through a data signal. The memory device may sample the data signal using a data strobe signal provided from the memory controller. To support stable operation of the memory device and the memory controller, when the memory device is powered on, a number of processes may be performed before the memory device and the memory controller reach an operational state. These processes may include training in relation to a data clock signal to compensate for a delay on a path for transferring a data clock signal.

SUMMARY

Aspects of the present disclosure provide a nonvolatile memory interface circuit which may perform off-chip compensation, a storage device having the same, and a method of operating the same.

According to an example embodiment of the present disclosure, a nonvolatile memory interface circuit includes a main path circuit configured to capture a data signal using a data strobe signal delayed based on offset information, and to output read data based on the data signal; a first capture path circuit configured to generate a plurality of first sampling data strobe signals by delaying the data strobe signal using first offset information, and to capture the data signal in response to each first sampling data strobe signal of the plurality of first sampling data strobe signals to output first sampling data; a second capture path circuit configured to generate a plurality of second sampling data strobe signals by delaying the data strobe signal using second offset information, and to capture the data signal in response to each second sampling data strobe signal of the plurality of second sampling data strobe signals to output second sampling data; and an off-chip compensation logic configured to determine a first error count between the read data, and determine the first sampling data and a second error count between the read data and the second sampling data, and to correct the offset information, the first offset information, and the second offset information using the first error count and the second error count.

According to an example embodiment of the present disclosure, a nonvolatile memory interface circuit includes a first delay line configured to receive a data signal and output a delayed data signal; a second delay line configured to receive a data strobe signal and output a plurality of sampling data strobe signals by delaying the data strobe signal; an output circuit configured to output the delayed data signal as read data in response to the data strobe signal; and an off-chip compensation logic configured to detect off-chip variation in real time by comparing the read data with sampling data corresponding to the plurality of sampling data strobe signals, and to compensate for the off-chip variation.

According to another example embodiment of the present disclosure, a storage device includes at least one nonvolatile memory device; and a controller configured to control the at least one nonvolatile memory device, wherein the controller includes a nonvolatile memory interface circuit configured to communicate with the at least one nonvolatile memory device through at least one channel, wherein the nonvolatile memory interface circuit includes a margin collector configured to collect margin information by comparing read data with sampling data; an on-chip margin search logic configured to track a valid window margin by adjusting an offset value based on the margin information; and a compensation calculator configured to determine off-chip variation corresponding to the offset value when the valid window margin is in a margin lock state.

According to another example embodiment of the present disclosure, a method of operating a controller configured to control at least one nonvolatile memory device includes counting left/right errors in a jitter histogram by comparing read data with sampling data; searching a valid window margin using a number of left/right errors; compensating offset information of a read path according to the valid window margin; determining that the valid window margin is in a margin lock state; and calculating off-chip variation using the offset information upon determining that the valid window margin is in the margin lock state.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Figure 1:
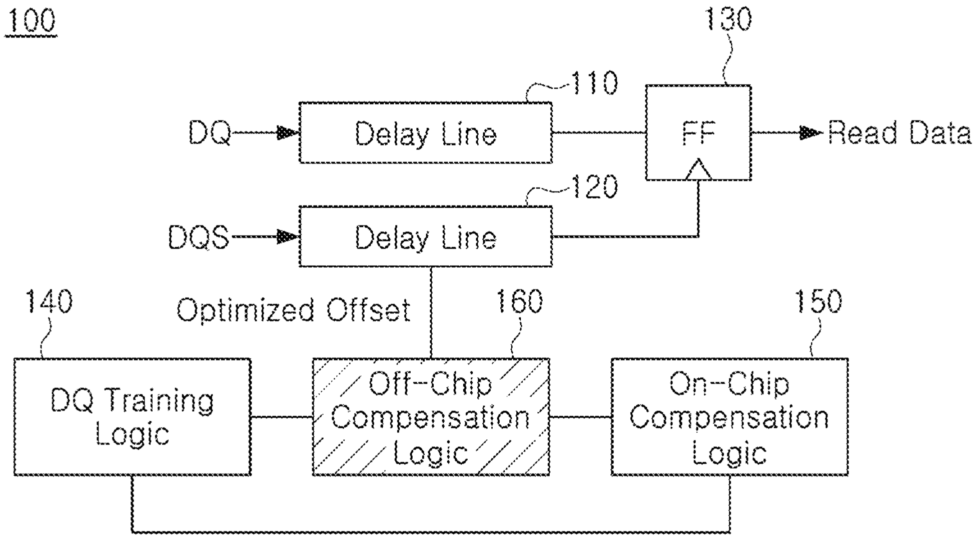
FIG. 1 is a diagram illustrating a nonvolatile memory interface circuit according to an example embodiment of the present disclosure.

In the following detailed description, reference is made to the accompanying drawings that show, by way of illustration, embodiments in which the invention may be practiced. Embodiments are described in sufficient detail to enable those skilled in the art to practice the invention. It is to be understood that various embodiments of the invention, although different, are not necessarily mutually exclusive. For example, a certain feature, structure, or characteristic described herein in connection with one embodiment may be implemented within other embodiments without departing from the spirit and scope of the invention. In addition, it is to be understood that the location or arrangement of individual elements within each embodiment may be modified without departing from the spirit and scope of the invention. The following detailed description is, therefore, not to be taken in a limiting sense, and the scope of the present inventive concept is defined only by the appended claims, appropriately interpreted, along with the full range of equivalents to which the claims are entitled. In the drawings, like numerals refer to the same or similar elements or functionality throughout the several views.

Hereinafter, embodiments of the present disclosure will be described as below with reference to the accompanying drawings.

A nonvolatile memory interface circuit according to an example embodiment, a storage device having the same, and a method of operating the same may sense an off-chip variation among variations occurring in the memory interface, and may perform compensation according to the sensed off-chip variation. The nonvolatile memory interface circuit in an example embodiment may be implemented with a margin collector, an on-chip margin search logic, and a compensation calculator. The margin collector may be configured to collect margin from the current set of data. The nonvolatile memory interface circuit in an example embodiment may sense off-chip variation by capturing a current set of data as a plurality of samples, and may compensate for the variation through a compensation calculator by tracking the variation through an on-chip margin search. The nonvolatile memory interface circuit in an example embodiment may compensate for variations occurring in real time. For example, the nonvolatile memory interface circuit in an example embodiment may sense and compensate for variation caused by the driver in the write path, and also variation occurring in the off-chip.

For high-speed communication, signal integrity of a data path may need to be secured. An interface of a nonvolatile memory device (e.g., NAND flash memory devices) may capture and use a data signal DQ and a data strobe signal DQS. The nonvolatile memory interface circuit 100 may be configured to capture (or identify) data provided in the DQ signal, using the DQS signal.

The DQ signal and the DQS signals may be bidirectional, wherein the same signals may be used for read transactions and write transactions. A plurality of DQ signals (e.g., 8) may be associated with a DQS signal.

Furthermore, a time window when data is valid to read may be referred to as a valid window margin. Generally, the valid window margin may decrease as a data rate increases. Other factors affecting the valid window margin may include duty cycle distortion, skew distortion, and PVT variations including a global process variation (P), a voltage variation (V), and a temperature variation (T) of transistors. In a case where the factors affecting a valid window margin may be reduced or compensated for, it may be possible to interface with the nonvolatile memory device at higher frequencies.

Generally, to secure a valid window margin, read/write DQ training, duty cycle correction (DCC) training, and on-chip variation compensation functions may be performed. The read/write DQ training may be performed at a stage in which a nonvolatile memory device is initialized, and may compensate for skew distortion of the data signal DQ and the data strobe signal DQS in a read path and a write path. The DCC training may be performed at a stage when the nonvolatile memory device is initialized, and may compensate for duty cycle distortion in the read path. By performing the read/write DQ training and the DCC training, a decrease in the valid window margin caused by duty cycle distortion and skew distortion may be compensated for or reduced. Accordingly, signal integrity of the nonvolatile memory device may be ensured. However, as the above-described trainings may be performed only at the stage in which the nonvolatile memory device is initialized, the trainings may not respond to variations occurring in real time. For example, a voltage/temperature variation may occur in real time, which may cause a decrease in valid window margin even in a case where a compensation has been determined during initialization.

Generally, a valid window margin may be increased/decreased during a process of initializing the nonvolatile memory device. When powered up, the nonvolatile memory device may be initialized, and DCC training and read/write DQ training may be performed. When powered up, distortions of a duty cycle and clock skew may be compensated for by parameters determined during the training, and a valid window margin may be ensured. Subsequently, as a normal operation may be performed, voltage/temperature (VT) variation may occur. This VT variation may affect both on-chip characteristics of the nonvolatile memory device and off-chip characteristics of the nonvolatile memory interface circuit, such that the valid window margin may be decreased. Also, typical on-chip variation compensation may sense variation occurring during runtime in a delay locked loop (DLL) circuit, and accordingly, variation may be compensated for in real time. However, only the variation occurring on-chip may be compensated for, and variation occurring off-chip may not be compensated for.

The nonvolatile memory interface circuit according to an example embodiment may track variation occurring off-chip using an on-chip margin search (OMS) method, and may quantify the off-chip variation obtained through a tracking process. This quantified off-chip variation may be used for write path compensation. Also, the off-chip variation may also be used for debugging features such as chip health monitoring.

FIG. 1 is a diagram illustrating a nonvolatile memory interface circuit 100 according to an example embodiment. The nonvolatile memory interface circuit 100 illustrated in FIG. 1 exhibits a read path of a nonvolatile memory physical layer (NVM PHY). Referring to FIG. 1, the nonvolatile memory interface circuit 100 may include a first delay line 110, a second delay line 120, an output circuit 130, DQ a training logic 140, an on-chip compensation logic 150, and an off-chip compensation logic 160.

The first delay line 110 may receive a DQ signal (data signal) and may be implemented to delay the DQ signal. In an example embodiment, the first delay line 110 may be implemented as a digitally controlled delay line (DCDL). The second delay line 120 may be implemented to receive and delay a DQS signal (data strobe signal). The second delay line 120 may be configured to output a plurality of sampling data strobe signals by delaying the DQS signal. In an example embodiment, the second delay line 120 may be implemented as a DCDL. The output circuit 130 may be implemented to output an output signal of the first delay line 110 in response to an output signal of the second delay line 120. In an example embodiment, the output circuit 130 may be implemented as a flip-flop. Further, the output of the output circuit 130 may be read data.

The DQ training logic 140 may be implemented to perform DQ training. The DQ training may be performed by the DQ training logic 140 upon power-up. Generally, an operation of initializing a nonvolatile memory device may include a ZQ calibration operation and a duty correction circuit (DCC) training operation. The ZQ calibration operation may include an operation of adjusting a strength of output drivers connected to a data signal/other signal lines to provide high data integrity, or an operation of setting on-die termination (ODT) values. The DCC training operation may ensure a valid data window by performing duty correction on a clock signal such as a read enable signal (IRE). After the DCC training operation, a read DQ training operation and a write DQ training operation may be performed. The read DQ training operation may adjust parameters of the nonvolatile memory device and the controller to optimize signal integrity or data-eye of data read from the nonvolatile memory device. The write DQ training operation may transmit write data to a nonvolatile memory device and may adjust parameters of the nonvolatile memory device and the controller to optimize signal integrity or data-eye of the transmitted data.

The on-chip compensation logic 150 may be implemented to compensate for on-chip variation occurring in real time. The on-chip compensation logic 150 may detect variations in a lock value in the delay locked loop (DLL) and may compensate for an offset value of the entirety of delay lines.

The off-chip compensation logic 160 may be implemented to compensate for variation occurring in an off-chip. The off-chip compensation logic 160 may perform an on-chip margin search, which may include a search for a valid window margin. For example, the off-chip compensation logic 160 may search for an improved or optimized value for the valid window margin. The off-chip compensation logic 160 may quantify an amount of off-chip variation using the valid window margin. The value quantified by the off-chip compensation logic 160 may be used for write path compensation.

The nonvolatile memory interface circuit 100 according to an example embodiment may detect off-chip variation in real time and may perform compensation according to the off-chip variation to be detected.

Figure 2:
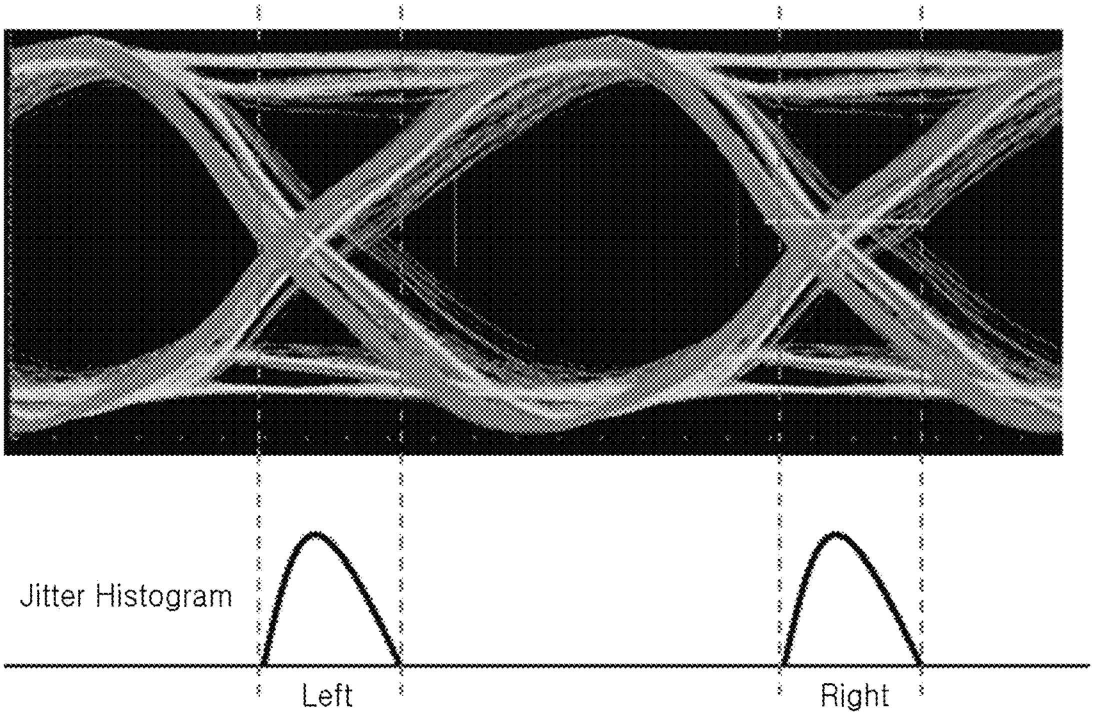
FIG. 2 is a diagram illustrating a jitter histogram related to a valid window margin of a read path of a nonvolatile memory interface circuit according to an example embodiment of the present disclosure.

FIG. 2 is a diagram illustrating an eye diagram and a jitter histogram related to a valid window margin of a read path of a nonvolatile memory interface circuit 100 according to an example embodiment. Generally, data training may refer to an operation of searching for, and adjusting a center of a valid window of the DQ signal. A left edge LE may be a closed portion on the left (or temporally first) of a unit interval UI (the valid window) of the DQ signal, and the right edge RE may be a closed portion on the right side (or temporally later) of the unit interval UI of the DQ signal.

Referring to FIG. 2, the valid window margin in the memory interface may be reduced due to various jitter components. As illustrated in FIG. 2, the eye diagram may be converted to the jitter histogram.

Figure 3:
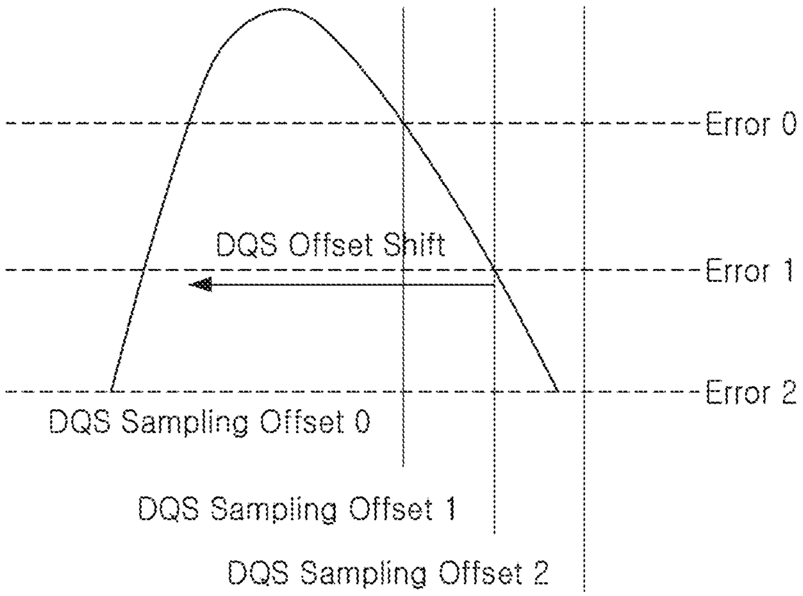
FIG. 3 is a diagram illustrating tracking off-chip variations of a nonvolatile memory interface circuit according to an example embodiment of the present disclosure.

FIG. 3 is a diagram illustrating tracking off-chip variations of a nonvolatile memory interface circuit 100 according to an example embodiment. Referring to FIG. 3, during an on-chip margin search, the number of errors at each point (left/right errors) may be counted using a plurality of samples of the DQS signal (or capture DQS) at each of the left edge LE and the right edge RE of the valid window margin. Using the number of errors counted as above, changes in the left edge LE and the right edge RE may be tracked.

Figure 4:
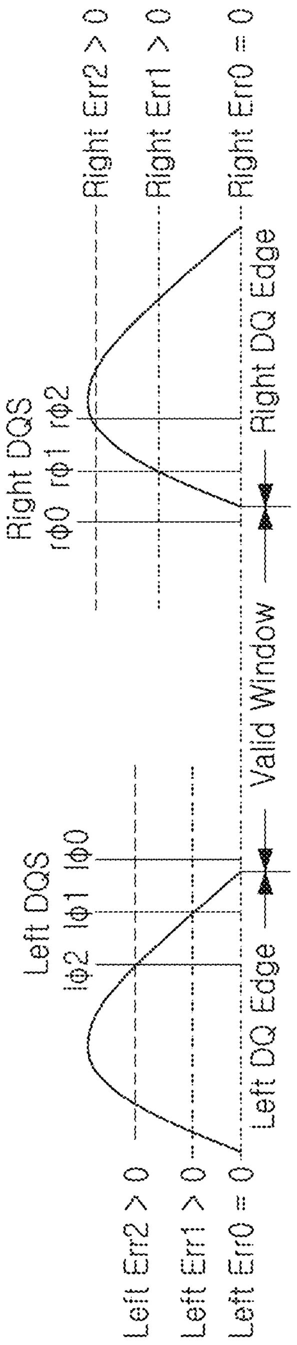
FIG. 4 is a diagram illustrating an initial state of an on-chip margin search according to an example embodiment of the present disclosure.

FIG. 4 is a diagram illustrating an initial state of an on-chip margin search according to an example embodiment. Referring to FIG. 4, an initial state may be a state before variation has occurred, and may be a state not deviated from the left edge LE (left DQ edge) and the right edge RE (right DQ edge) searched for in the first read/write DQ training. This state in which the left edge LE and the right edge RE do not deviate may be referred to as a locking condition.

Figure 5:
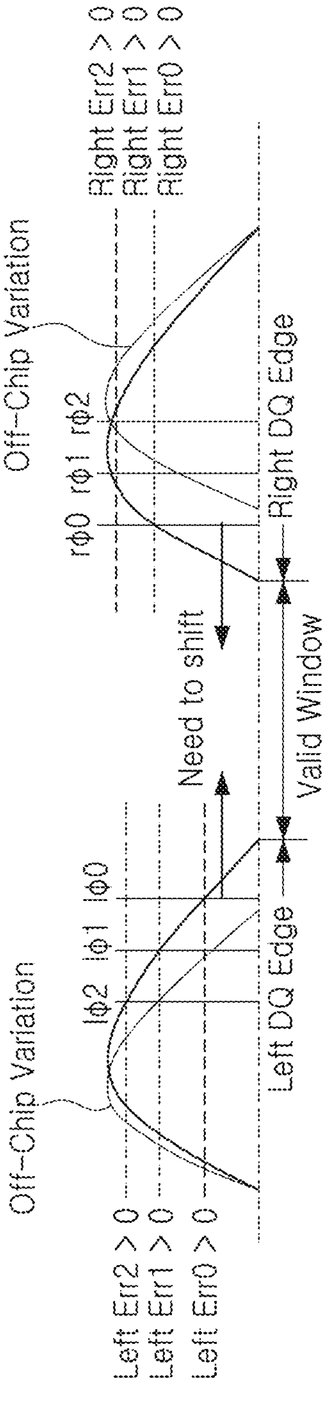
FIG. 5 is a diagram illustrating off-chip variations of an on-chip margin search according to an example embodiment of the present disclosure.

FIG. 5 is a diagram illustrating off-chip variations of an on-chip margin search according to an example embodiment. As illustrated in FIG. 5, when off-chip variation occurs during a normal operation, a jitter histogram may move, as compared to an initial state. In this case, the number of errors in data captured in each sampling of the DQS signal may change as compared to the initial state. During the on-chip margin search, the variation may be sensed, and edge changes may be tracked while appropriately moving the sampling of the DQS signal.

Figure 6:
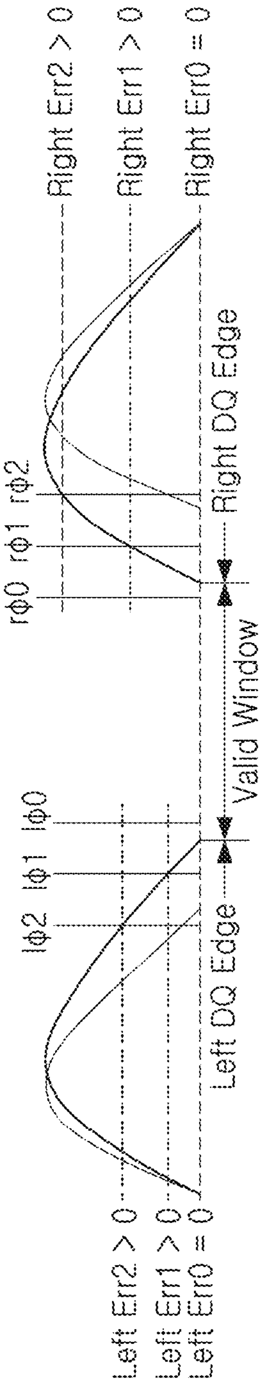
FIG. 6 is a diagram illustrating tracking and compensation of an on-chip margin search according to another example embodiment of the present disclosure.

FIG. 6 is a diagram illustrating tracking and compensation of an on-chip margin search according to another example embodiment. As illustrated in FIG. 6, values of the left edge and the right edge may be searched for, and the valid window margin adjusted according to an off-chip variation. Off-chip variation calculation may compare each searched for (e.g., re-searched) edge with the state before the search by tracking in the on-chip margin search, may determine the amount of the adjustment, and may select and use the off-chip variation component.

In addition to off-chip variation occurring in real time, there may also be variation occurring on-chip. The variation occurring on-chip and the variation occurring off-chip may be accurately distinguished such that accurate off-chip variation may be determined. In an example embodiment, the off-chip variation value may be used to compensate for the write path. In another example embodiment, the off-chip variation value may be used for debugging features such as chip health monitoring or telemetry. Also, the off-chip variation value may be used as criteria for performing re-training or periodic training.

Generally, on-chip compensation may be performed through a read path in real time when read DMA (direct memory access) is performed during runtime. The write path may be compensated with an offset value determined in a compensation calculator 163. A main path may capture the DQ signal using the DQS signal, and output read data based on the DQ signal. In example embodiments, by adding capture paths to the main path, variations occurring in off-chip may be compensated for through an off-chip compensation logic.

Figure 7:
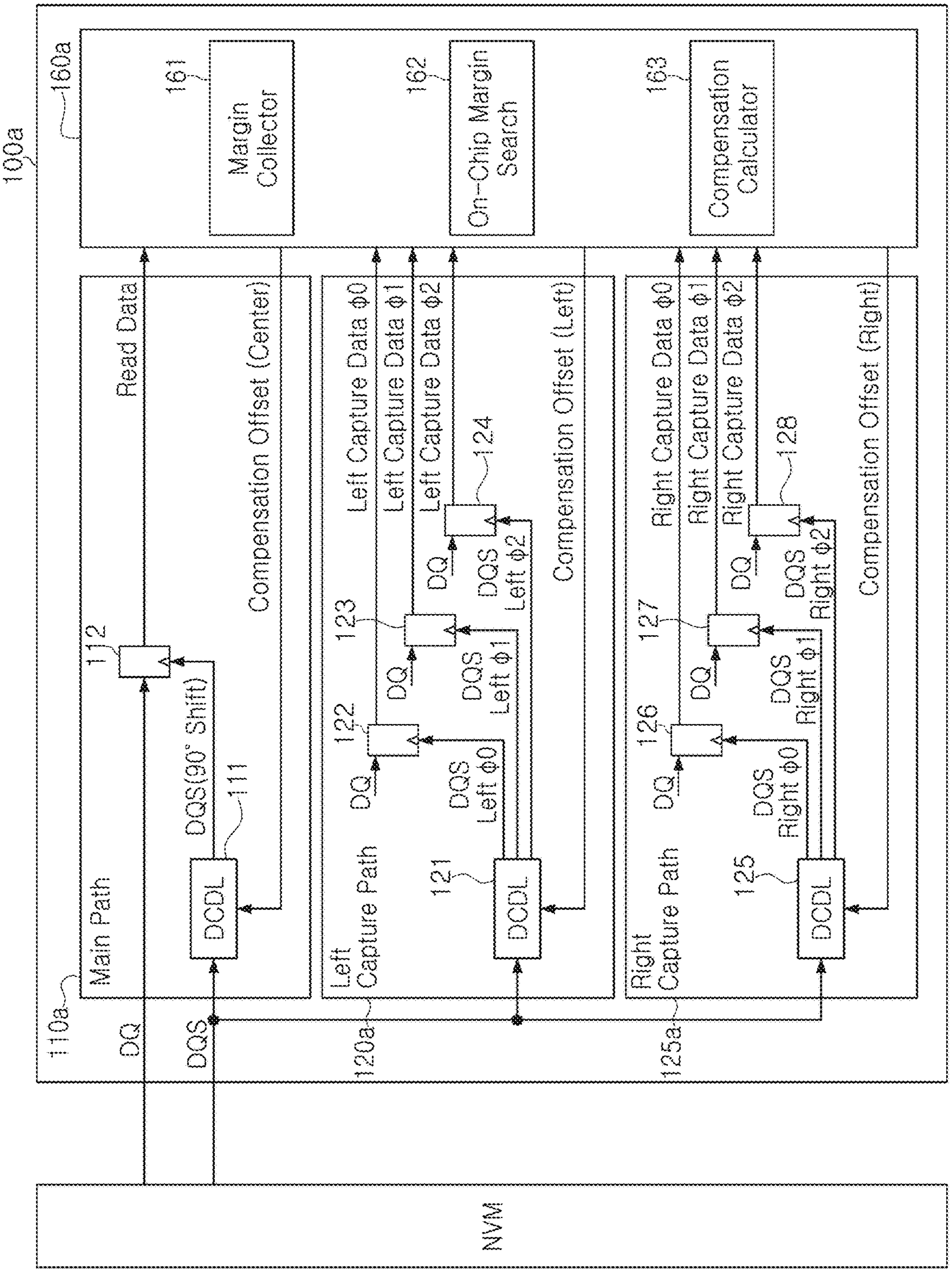
FIG. 7 is a diagram illustrating a nonvolatile memory interface circuit according to an example embodiment of the present disclosure.

FIG. 7 is a diagram illustrating a nonvolatile memory interface circuit 100*a* according to an example embodiment. Referring to FIG. 7, the nonvolatile memory interface circuit 100*a* may include a main path circuit 110*a*, a first capture path circuit 120*a*, a second capture path circuit 125*a*, and an off-chip compensation logic 160*a*.

The main path circuit 110*a* may be configured as a main path, may receive a DQ signal and a DQS signal, and may be implemented to output a DQ signal in response to a delayed DQS signal. The main path circuit 110*a* may include a main flip-flop 112 configured to output a DQ signal (Read Data) in response to the DQS signal, and a delay line 111 (DCDL) configured to delay the DQS signal according to compensation offset information. In an example embodiment, the delay line 111 may change a phase of the DQS signal by 90 degrees (DQS(90° Shift)). Here, compensation offset information (e.g., Compensation Offset (Center)) may be output from the off-chip compensation logic 160*a*. Here, a phase-shifted DQS signal (DQS(90° Shift) may be output from the delay line 111 (DCDL). The main flip-flop 112 may be configured to output read data based on the DQ signal in response to the phase-shifted DQS signal. For example, the main flip-flop 112 capture the DQ signal using the aligned phase-shifted DQS signal.

The capture path may include a left capture path for capturing data to be used for tracking the left side of the valid window margin and a right capture path for capturing data to be used to track the right side.

The first capture path circuit 120*a* may be configured as a left capture path. The first capture path circuit 120*a* may include a left capture delay line 121, and flip-flops 122, 123, and 124 (e.g., first output circuit, second output circuit, and third output circuit, respectively). The left capture delay line 121 may be implemented to delay the DQS signal according to left compensation offset information (e.g., Compensation Offset (Left)). Here, the left compensation offset information may be output from the off-chip compensation logic 160*a*. The first flip-flop 122 may be implemented to output the first DQ signal in response to the first sampling DQS signal having a first left phase (left Φ0). The second flip-flop 123 may be implemented to output a second DQ signal in response to the second sampling of the DQS signal having a second left phase (left Φ1). The third flip-flop 124 may be implemented to output a third DQ signal in response to the third sampling of the DQS signal having a third left phase (left Φ2).

The second capture path circuit 125*a* may be configured as a right capture path. The second capture path circuit 125*a* may include a right capture delay line 125, and flip-flops 126, 127, and 128 (e.g., fourth output circuit, fifth output circuit, and sixth output circuit, respectively). The right capture delay line 125 may be implemented to delay the DQS signal according to right compensation offset information(e.g., Compensation Offset (Right)). Here, the right compensation offset information may be output from the off-chip compensation logic 160*a*. The fourth flip-flop 126 may be implemented to output a fourth DQ signal in response to the fourth sampling of the DQS signal having a first right phase (right Φ0). The fifth flip-flop 127 may be implemented to output the fifth DQ signal in response to the fifth sampling of the DQS signal having a second right phase (right Φ1). The sixth flip-flop 128 may be implemented to output a sixth DQ signal in response to the sixth sampling of the DQS signal having a third right phase (right Φ2).

Each of the first capture path circuit 120*a* and the second capture path circuit 120*b* may generate at least three sampling DQS signals, may capture DQ signals in response to each generated sampling DQS signal, and may transmit the captured DQ signals to the off-chip compensation logic 106*a*. For example, the first capture path circuit 120*a* may generate at least three sampling DQS signals including DQS Left Φ0, DQS Left Φ1, DQS Left Φ2. The first capture path circuit 120*a* may capture DQ signals in response to each generated sampling DQS signal. And the first capture path circuit 120*a* may transmit the captured DQ signals including Left Capture Data Φ0, Left Capture Data Φ1, Left Capture Data Φ2 to the off-chip compensation logic 106*a*. The off-chip compensation logic 160*a* may receive the first DQ signal to the sixth DQ signal, may sense the off-chip variation, and may be implemented to output compensation offset information according to the off-chip variation that has been sensed. For example, the off-chip compensation logic 160*a* may output Compensation Offset (Left), which may be received by the first capture path circuit 120*a*.

Referring again to FIG. 7, the off-chip compensation logic 160*a* may include a margin collector 161, an on-chip margin search logic 162, and a compensation calculator 163. The margin collector 161 may compare the read data received from the main path with the captured data received from the first capture path circuit 120*a* and the second capture path circuit 120*b*, and may count the number of errors for each sampling data. In other words, the margin collector 161 may count errors in actual data and capture data for each phase. The on-chip margin search logic 162 may be implemented to search for a valid window margin using the error count information received from the margin collector 161. For example, the on-chip margin search logic 162 may search for an offset by tracking the left edge and the right edge of the valid window margin. In other words, the on-chip margin search logic 162 may determine whether to increase or decrease the offset based on the counted error value. The compensation calculator 163 may be implemented to determine accurate off-chip variation offset based on the amount of change in the left edge and right edge searched for by the on-chip margin search logic 162. In other words, the compensation calculator 163 may determine an offset configured to compensate for off-chip variation based on the value when the valid window margin is locked.

Figure 8:
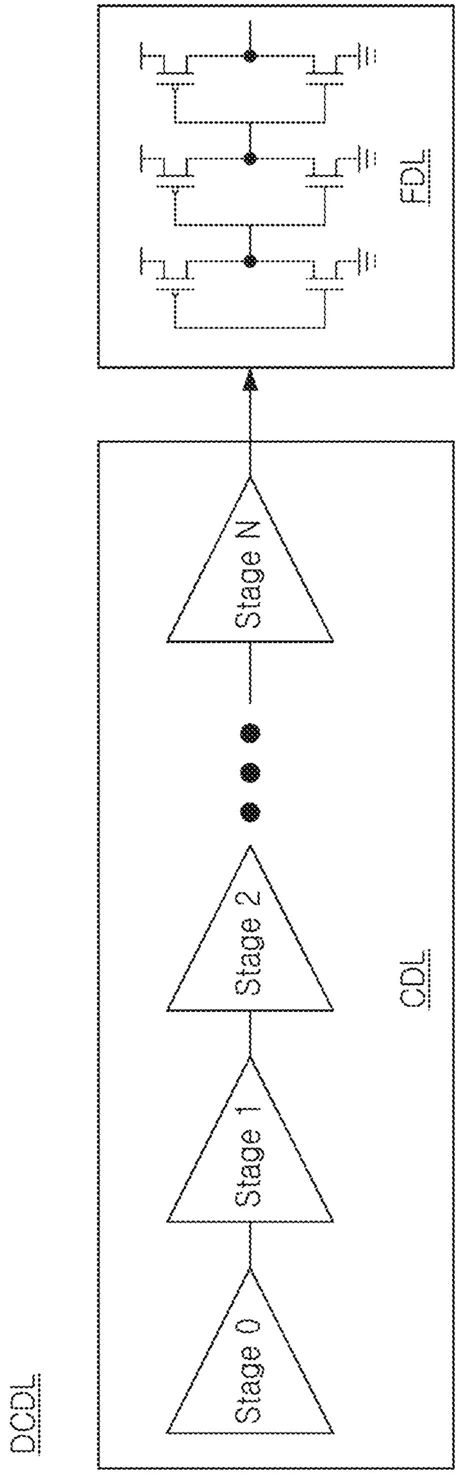
FIG. 8 is a diagram illustrating a delay line according to an example embodiment of the present disclosure.

FIG. 8 is a diagram illustrating a delay line according to an example embodiment. Referring to FIG. 8, a digital controlled delay line (DCDL) may include a coarse delay line (CDL) and a fine delay line (FDL). The CDL may include stages (0-N) connected to each other in series, where N is a positive integer. The FDL may include inverters connected to each other in series. Here, each of the inverters may be implemented as a P-channel metal oxide semiconductor (PMOS) transistor and an N-channel metal oxide semiconductor (NMOS) transistor connected to a common gate.

Figure 9:
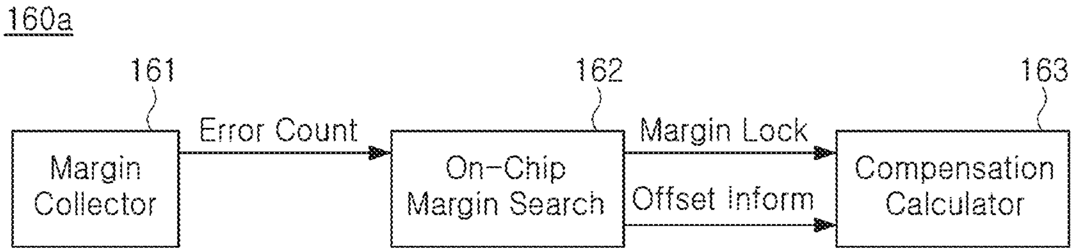
FIG. 9 is a diagram illustrating operations of an off-chip compensation logic according to an example embodiment of the present disclosure.

FIG. 9 is a diagram illustrating operations of an off-chip compensation logic 160*a* according to an example embodiment. Referring to FIG. 7, FIG. 8, and FIG. 9, the off-chip compensation logic 160*a* may perform off-chip compensation operation. The margin collector 161 may generate error count values using an DQ signal output from the main path and DQ signals of the first capture path circuit 120*a* and the second capture path circuit 120*b* received by the sampling DQS signals. That is, the margin collector 161 may receive read data and the sampling data. Here, sampling data may be captured based on a plurality of sampling data strobe signals. In an example embodiment, the plurality of sampling data strobe signals may include at least two sampling DQS signals. The on-chip margin search logic 162 may generate a margin lock and offset information (inform) using error count values. In other words, the on-chip margin search logic 162 may receive margin information from the margin collector 161. The on-chip margin search logic 162 may be implemented as a feedback loop to turn the valid window margin into a margin lock state. The compensation calculator 163 may determine offset information creating a margin lock. For example, the compensation calculator 163 may determine an optimal offset information creating a margin lock. Off-chip variation may be compensated for in real time based on the offset information. In an example embodiment, when the valid window margin is in the margin lock state, the compensation calculator 163 may receive margin information from the on-chip margin search logic 162 and may determine the off-chip variation corresponding to the received margin information. In an example embodiment, the off-chip variation may be used as criteria for performing DQ re-training or periodic training.

Figure 10:
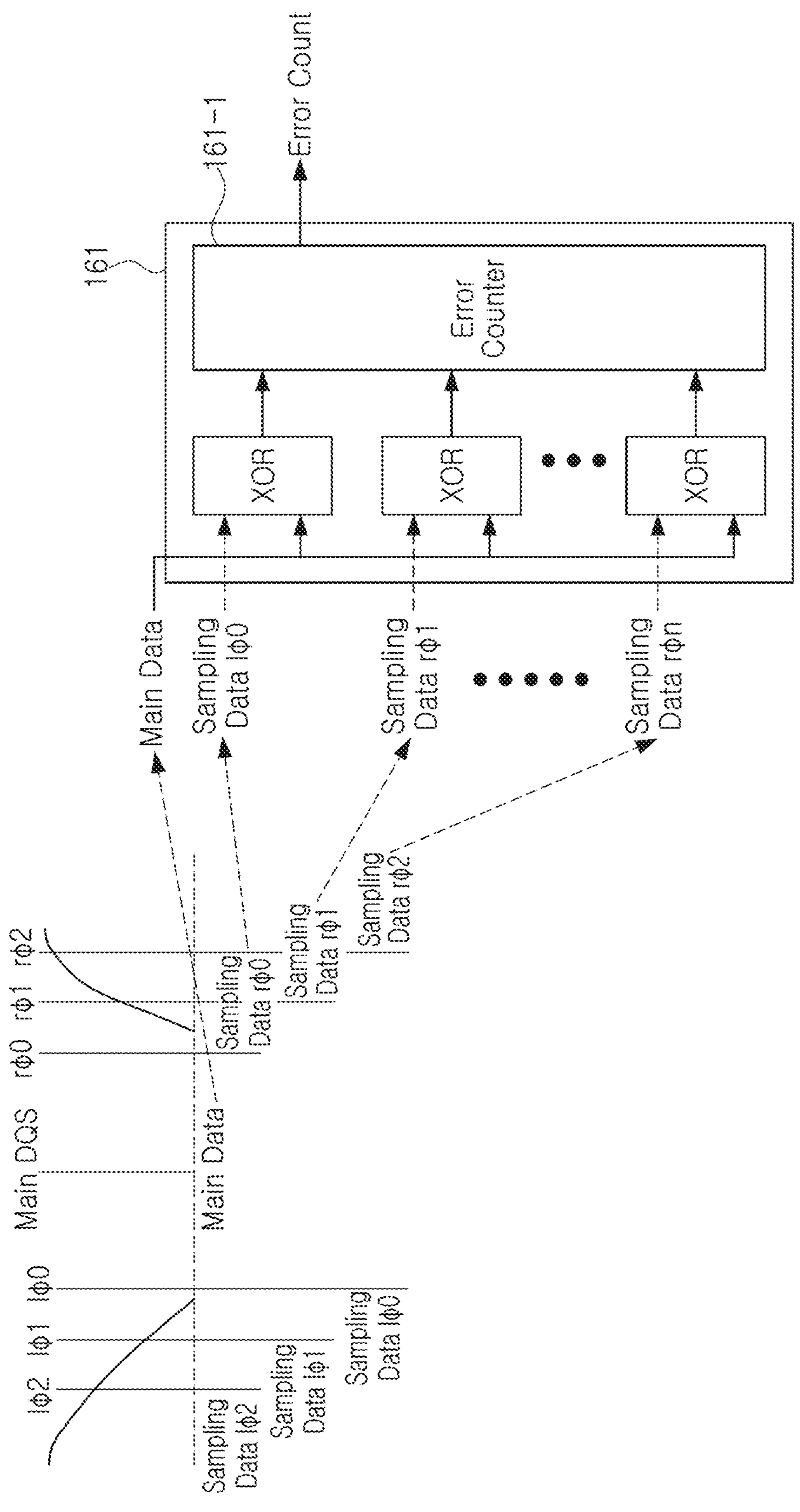
FIG. 10 is a diagram illustrating operations of a margin collector according to an example embodiment of the present disclosure.

FIG. 10 is a diagram illustrating operations of a margin collector 161 according to an example embodiment. Referring to FIG. 10, the margin collector 161 may include a plurality of XOR circuits and an error counter 161-1. Each of the plurality of XOR circuits may receive the main data and a corresponding sampling data. Each of the plurality of XOR circuits may perform an XOR computation on the main data and the corresponding sampling data, and may be implemented to output performance results to the error counter 161-1. Here, the main data may be a DQ signal output from the main path circuit 110*a*, and each of the sampling data may be a DQ signal output from the first capture path circuit 120*a* and the second capture path circuit 120*b*. Each of the DQ signals output herein may be a DQ signal captured in response to the corresponding sampling DQS signal. For example, first sampling data may be captured in response to a first sampling DQS signal having a first left phase (DQS Left Φ0), second sampling data may be captured in response to a second sampling DQS signal having a second left phase (DQS Left Φ1), third sampling data may be captured in response to the third sampling DQS signal having the third left phase (DQS Left Φ2), fourth sampling data may be captured in response to the fourth sampling DQS signal having the first right phase (DQS Right Φ0), fifth sampling data may be captured in response to the fifth sampling DQS signal having a second right phase (DQS Right Φ1), and sixth sampling data may be captured in response to the sixth sampling DQS signal having a third right phase (DQS Right Φ2). The number of the sampling DQS signals and the number of different of sampling data may not be limited thereto.

The margin collector 161 may generate three or more sampling DQS signals in the left capture path (first capture path circuit 120*a*) and the right capture path (the second capture path circuit 120*b*) during a read DMA operation, and may capture a DQ signal using the generated sampling DQS signals. The margin collector 161 may compare read data normally captured in the main path circuit 110*a* and sampling data captured by each sampling DQS signal, may determine whether there is an error as a result of the comparison. The margin collector 161 may accumulate the number of errors when there is an error, thereby generating a count value. In an example embodiment, when the number of errors is accumulated and counted for a Read DMA, the number of errors may appear for each sampling data. The error count information may be transmitted to the on-chip margin search logic 162.

Figure 11A:
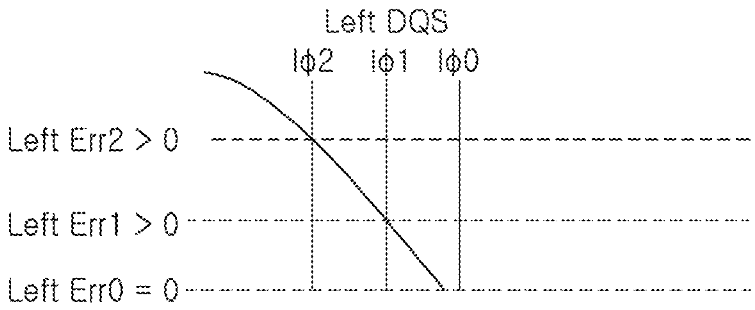
FIG. 11A, FIG. 11B, and FIG. 11C are diagrams illustrating left edge tracking in on-chip margin search logic according to an example embodiment of the present disclosure.
Figure 11B:
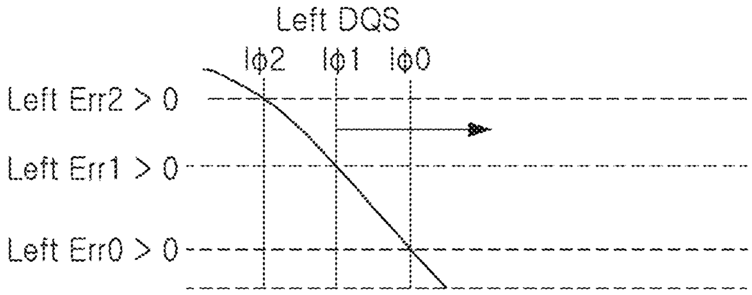
Figure 11C:
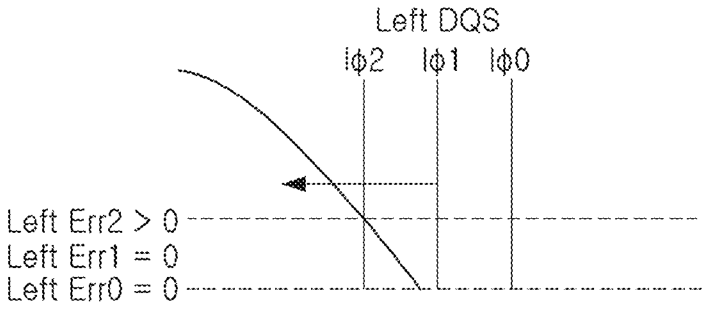

FIG. 11A, FIG. 11B, and FIG. 11C are diagrams illustrating left edge tracking in on-chip margin search logic 162 according to an example embodiment. Referring to FIG. 11A, a state in which variation has not yet occurred or was searched for by tracking variation having occurred is illustrated. This state may be referred to as a margin lock. The margin lock state may have an error count of 0 in the first sampling data among the first through third sampling data, and the second sampling data and the third sampling data may have an error count greater than 0. Here, the first sampling data may be the DQ signal captured in response to the first sampling DQS signal having the left first phase signal (DQS Left Φ0), the second sampling data may be a DQ signal captured in response to the second sampling DQS signal having the left second phase signal (DQS Left Φ1), and the third sampling data may be the DQ signal captured in response to the third sampling DQS signal having the left third phase signal (DQS Left Φ2). Referring to FIG. 11B, a state in which the left sampling DQS signal may need to move to the right is illustrated. When the jitter moves due to variation, the number of errors at each sampling point may change. As illustrated in FIG. 11B, the number of errors in the entirety of the first to third sampling data may be greater than 0. In this case, the left sampling DQS signal may be moved to the right, which may improve the offset correction. Referring to FIG. 11C, a state in which the left sampling DQS signal may need to move to the left is illustrated. As illustrated in FIG. 11C, the number of errors in first sampling data and second sampling data may be 0. In this case, the left sampling DQS signal may be moved to the left, which may improve the offset correction.

Figure 12A:
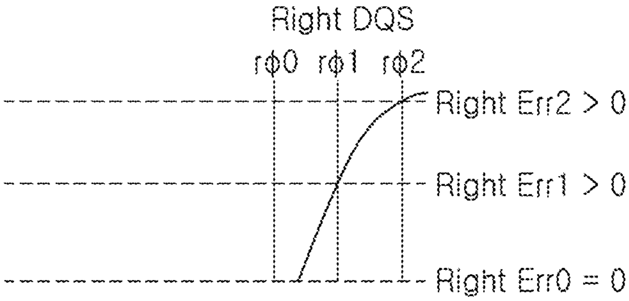
FIG. 12A, FIG. 12B, and FIG. 12C are diagrams illustrating right edge tracking of on-chip margin search logic according to an example embodiment of the present disclosure.
Figure 12B:
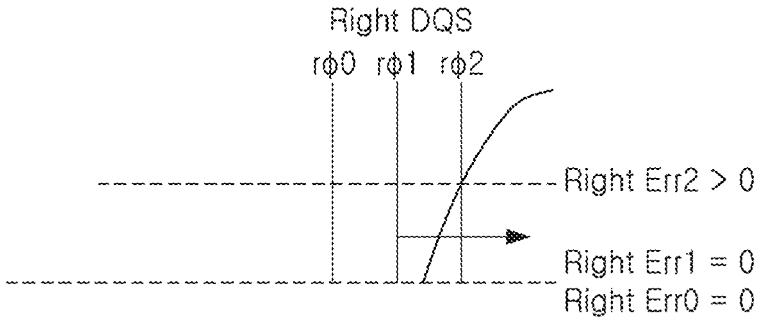
Figure 12C:
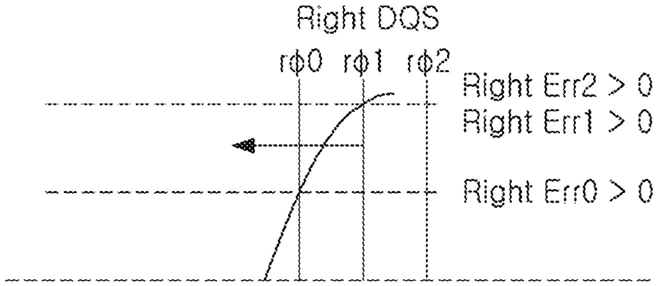

FIG. 12A, FIG. 12B, and FIG. 12C are diagrams illustrating right edge tracking of on-chip margin search logic 162 according to an example embodiment. Referring to FIG. 12A, when the number of errors is 0 in the fourth sampling data, and the number of errors in the second sampling, fifth sampling data and sixth sampling data is greater than 0, the state may be a margin lock state. Here, the fourth sampling data may be a DQ signal captured in response to the fourth sampling DQS signal having a right first phase signal (DQS Right Φ0), the fifth sampling data may be a DQ signal captured in response to the fifth sampling DQS signal having the right second phase signal (DQS Right Φ1), and the sixth sampling data may be a DQ signal captured in response to the sixth sampling DQS signal having the right third phase signal (DQS Right Φ2). Referring to FIG. 12B, when the number of errors in the fourth sampling data and the fifth sampling data is 0, and the number of errors in the sixth sampling data is greater than 0, the right sampling DQS signal may be moved to the right. Referring to FIG. 12C, when the number of errors in the fourth to sixth sampling data are greater than 0, the right sampling DQS signal may be moved the left.

Figure 13:
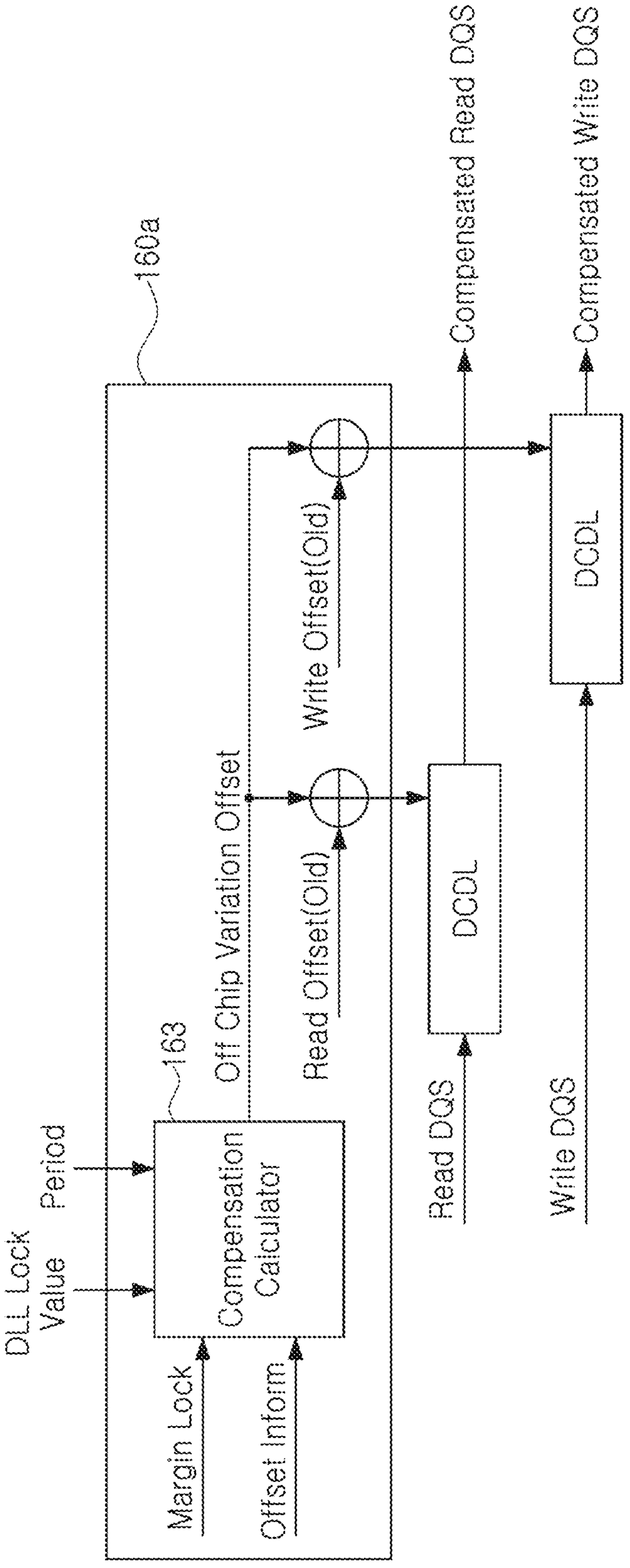
FIG. 13 is a diagram illustrating operations of a compensation calculator according to an example embodiment of the present disclosure.

FIG. 13 is a diagram illustrating operations of a compensation calculator 163 according to an example embodiment. Referring to FIG. 13, when margin lock occurs in on-chip margin search, the compensation calculator 163 may be implemented to determine off-chip offset variation based on offset information. For example, the compensation calculator 163 may determine the amount of variation based on the previous offset information when the state is a previous margin lock and the current offset information when the state is a new margin lock. The compensation calculator 163 may compensate for a DQS offset of a write path based on the amount of variation. In an example embodiment, the compensation calculator 163 may also consider influence of on-chip variation when determining compensation values.

The compensation calculator 163 may operate in a margin locked state, and may receive state information (e.g., whether the state is margin lock) from the on-chip margin search logic 162, and offset information when the state information indicates a margin lock. The compensation calculator 163 may determine the amount of off-chip variation based on the previous offset information of the previous margin lock and the current offset information when the state is newly in a margin lock. When determining off-chip variation, the amount of off-chip variation may be determined, for example, using Equation 1 by considering the amount of on-chip variation.

$$\text{Off Chip Variation Offset} = \left[\left(\frac{\text{Period}}{DLL\ \text{Lock Value (New)}} \times DQS\ \text{Offset (New)}\right) - \left(\frac{\text{Period}}{DLL\ \text{Lock Value (Old)}} \times DQS\ \text{Offset (Old)}\right)\right] \times \frac{DLL\ \text{Lock Value (New)}}{\text{Period}} \quad \text{[Equation 1]}$$

When the lock value of the delay locked loop (DLL) configured to track a cycle of the clock becomes a margin lock, and during the old (e.g., previous) offset (DQS Offset (Old)) of the old (e.g., previous) margin lock and the new margin lock, the new offset (DQS Offset) may be determined. The stored DLL lock value stored in this stage may be used in a variation offset calculation. As described herein, after quantifying the variation occurring in off-chip, the write DQS offset may be determined, for example, using Equation 2 to compensate for the write path rather than the read path.

$$\text{Write } DQS \text{ Offset} = (\text{Write } DQS \text{ Offset} \times \text{OnChip Variation}) + \text{OffChip Variation Offset} \quad \text{[Equation 2]}$$

Accordingly, in the case of the read path, off-chip variation may be compensated for in real time whenever the read DMA operates by the on-chip margin search logic 162. In the case of the write path, compensation may be performed when the state is in the margin lock by tracking the valid window margin in the read path.

A nonvolatile memory interface circuit according to an example embodiment may compare main data with sampling data of the main path in real time during read DMA, may detect off-chip variation according to the result of comparison, and may compensate for the detected variation.

Figure 14:
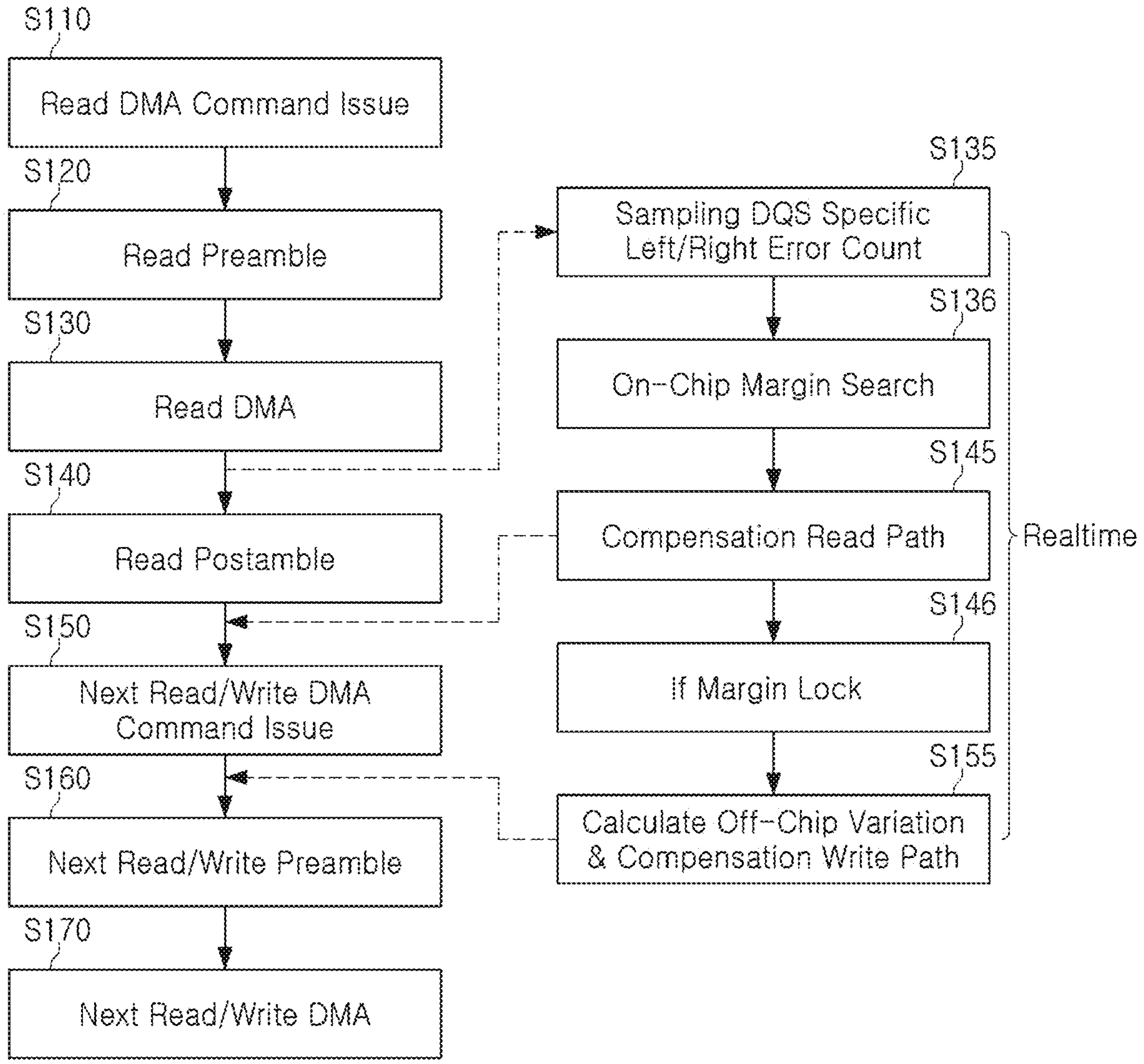
FIG. 14 is a diagram illustrating a method of a nonvolatile memory interface circuit according to an example embodiment of the present disclosure.

FIG. 14 is a diagram illustrating a method of a nonvolatile memory interface circuit according to an example embodiment. Referring to FIG. 14, off-chip compensation operations (S135, S136, S145, S146, and S155) may be performed during runtime performing normal operations (S110, S120, S130, S140, S150, S160, and S170). In an example embodiment, an off-chip compensation operation may be performed in real time based on off-chip compensation logic during the runtime of the normal operation. Among the normal operations, when a read operation is performed, a read DMA command may be issued to a nonvolatile memory device (NVM) (S110). Thereafter, the read preamble interval for the read operation may be performed (S120). Thereafter, the read DMA may be performed (S130).

When read DMA is performed, the off-chip compensation logic 160*a* may generate a left sampling DQS signal and a right sampling DQS signal, capture the DQ signal as each of sampling DQS signals, generate sampling data from the captured DQ signal, and accumulate error count by comparing the sampling data with the read data of the main path (S135). The on-chip margin may be searched for based on error count (S136). A read postamble interval (e.g., used to smooth a hand-off between read and write) may be performed after the read DMA (S140). Meanwhile, the valid window margin of the read path may be compensated for (S145) and a next read/write DMA command may be issued (S150). When the state is a margin lock (S146), the compensation calculator may determine the off-chip variation offset and may compensate for the write path before a next command is performed (S155). Thereafter, the next read/write preamble interval may be performed (S160), and the next read/write DMA may be performed (S170).

In an example embodiment, by capturing data signals based on a plurality of sampling data strobe signals having different phases, sampling data may be output. In an example embodiment, when the valid window margin is not in the margin lock state, each phase of the plurality of sampling data strobe signals may be corrected. In an example embodiment, the offset of the delay line of the read data strobe signal may be corrected by adding the off-chip variation to the old read offset. In an example embodiment, the offset of the delay line of the write data strobe signal may be corrected by adding the off-chip variation to the old write offset.

The off-chip compensation logic according to an example embodiment may count errors in hardware for each sampling DQS and may track the left edge and the right edge based on the count. In a case where hardware automation is used, elements that may intervene from a system perspective may be omitted, and settings such as a difference in offset for each sampling DQS or the number of sampling DQS may be tuned. Generally, when the offset for each sampling DQS is tight and the number of sampling DQS is also relatively large, the left edge and the right edge may be further tracked. These settings may be available when hardware is initialized in software.

A nonvolatile memory interface circuit according to an example embodiment may improve a read margin (e.g., read signal intensity (SI) margin) with read off-chip variation compensation. The nonvolatile memory interface circuit in an example embodiment may be similarly applied to the write path by quantifying the off-chip variation, and may improve a write margin (e.g., write SI margin). The nonvolatile memory interface circuit in an example embodiment may enable a more accurate valid window search than may be achieved by read training. Since the nonvolatile memory interface circuit in an example embodiment may track the actual data pattern rather than the training pattern as a base, the circuit may also be used for chip health monitoring or telemetry based on the number of errors counted during each Read DMA. The nonvolatile memory interface circuit in an example embodiment may be used as criteria for performing DQ re-training or periodic training.

Figure 15:
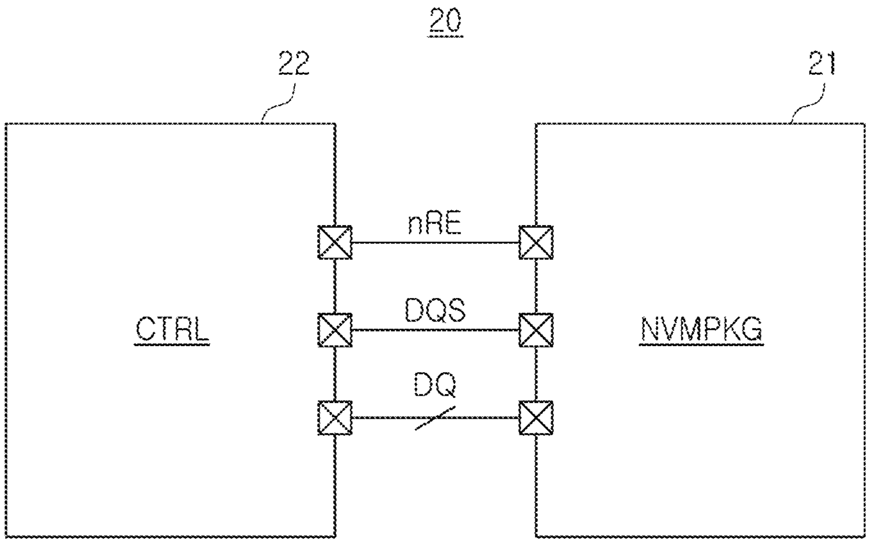
FIG. 15 is a diagram illustrating a storage device according to an example embodiment of the present disclosure.

FIG. 15 is a diagram illustrating a storage device 20 according to an example embodiment. Referring to FIG. 15, the storage device 20 may include a nonvolatile memory package 21 (NVM PKG) and a controller 22 (CTRL) for controlling the nonvolatile memory package 21.

The nonvolatile memory package 21 (NVMPKG) may include an interface chip (frequency boosting interface chip (FBI), or "buffer chip") and a plurality of nonvolatile memory devices connected to internal channels. In an example embodiment, an interface chip may be connected to the controller 22 through a channel. Here, the channel may be connected to the first internal channel or the second internal channel through an interface chip. The interface chip may include a retraining check circuit for internally determining the need for retraining. Also, the interface chip may implement an interface protocol for communicating with the controller 22 and an interface protocol for communicating with nonvolatile memory device in a compatible manner. A plurality of nonvolatile memory devices may be connected to the internal channels, respectively. In an example embodiment, the plurality of nonvolatile memory devices of the nonvolatile memory package 21 may be implemented in a stacked structure. Here, each nonvolatile memory device of the plurality of nonvolatile memory devices may be implemented to perform an off-chip compensation operation, as described in FIGS. 1 to 14.

The controller 22 (CTRL) may be implemented to control overall operations of the nonvolatile memory package 21. The controller 22 may perform functions for data management of the nonvolatile memory package 21, such as address mapping, error correction, garbage collection, wear-leveling, bad block management, or data recovery. Here, these functions may be implemented in terms of hardware, software, firmware, or a combination thereof.

Figure 16:
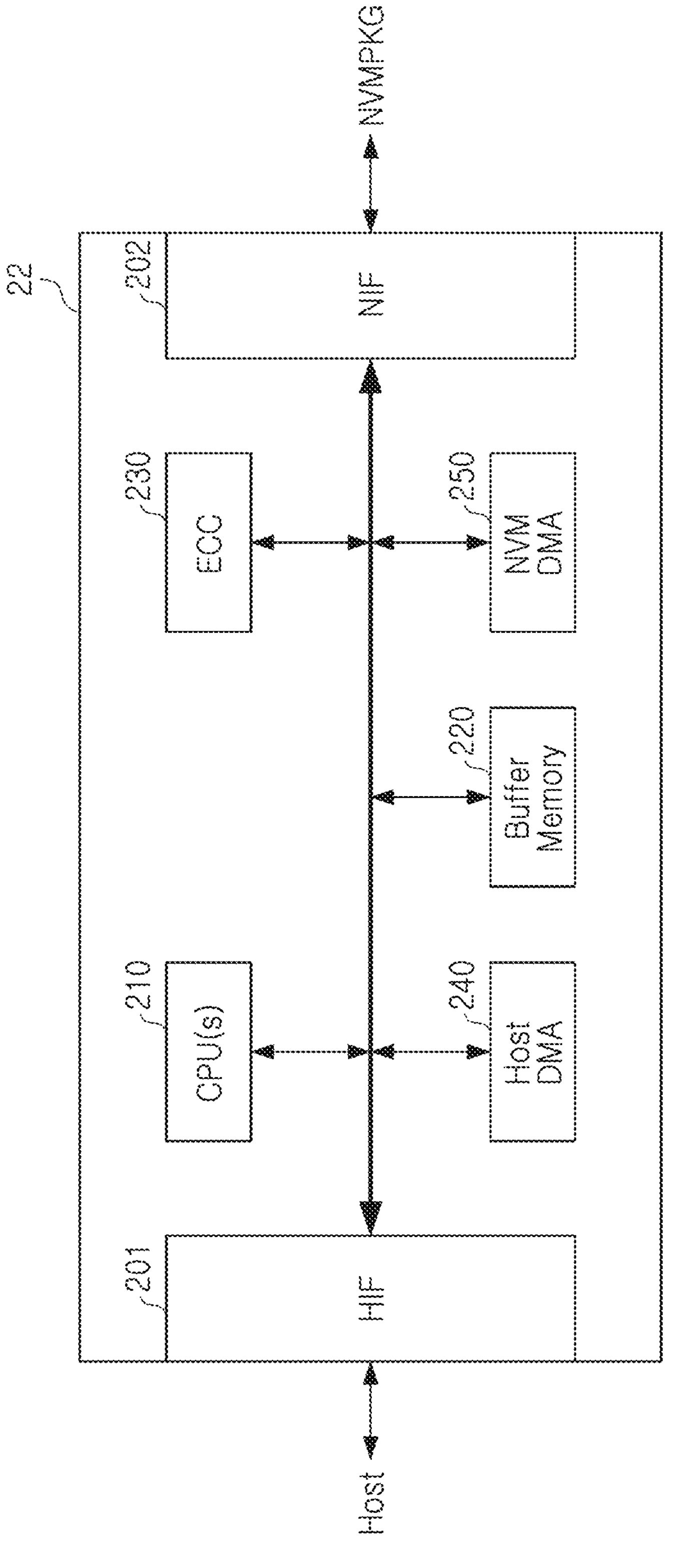
FIG. 16 is a diagram illustrating a controller according to an example embodiment of the present disclosure.

FIG. 16 is a diagram illustrating a controller 22 according to an example embodiment. Referring to FIG. 16, the controller 22 may include a host interface circuit 201, a nonvolatile memory interface circuit 202, a bus, at least one processor 210 (CPCs), a buffer memory 220, an error correction circuit 230 (ECC), a host DMA circuit 240 and a nonvolatile memory DMA circuit 250.

The host interface circuit 201 may be implemented to transmit/receive packets with a host. A packet transmitted from the host to the host interface circuit 201 may include a command or write data to a nonvolatile memory device. A packet transmitted from the host interface circuit 201 to the host may include a response to a command or read data from a nonvolatile memory device.

The nonvolatile memory interface circuit 202 may transmit write data to the nonvolatile memory or may receive read data from the nonvolatile memory. The nonvolatile memory interface circuit 202 may be implemented to comply with standard protocols such as JEDEC (Joint Electron Device Engineering Council) or ONFI (Open NAND Flash Interface).

At least one processor 210 (CPUs) may be implemented to control overall operations of the storage device 20. The processor 210 may perform various management functions such as cache/buffer management, firmware management, garbage collection management, wear leveling management, data deduplication management, read refresh/reclaim management, bad block management, multi-stream management, mapping management between host data and nonvolatile memory, quality of service (QoS) management, system resource allocation management, nonvolatile memory queue management, read level management, erase/program management, hot/cold data management, power loss protection management, dynamic thermal management, or initialization management. These example management operations may be implemented in terms of hardware, software, firmware, or a combination thereof.

The buffer memory 220 may temporarily store data to be written to a nonvolatile memory device or read data from a nonvolatile memory device. In an example embodiment, the buffer memory 220 may be configured as a component included in the controller 22. In another example embodiment, the buffer memory 220 may be disposed external to the controller 22. Also, the buffer memory 220 may be implemented as a volatile memory (e.g., static random access memory (SRAM), dynamic RAM (DRAM), synchronous RAM (SDRAM), or the like) or a nonvolatile memory (flash memory, phase-change RAM (PRAM), magneto-resistive RAM (MRAM), resistive RAM (ReRAM), ferroelectric RAM (FRAM), or the like).

The error correction circuit 230 may be implemented to generate an error correction code during a program operation and to recover data using the error correction code during a read operation. That is, the error correction circuit 230 may generate an error correction code to correct fail bits or error bits of data received from a nonvolatile memory device. Also, the error correction circuit 230 may form data to which a parity bit is added by performing error correction encoding on data provided by a nonvolatile memory device. Parity bits may be stored in a nonvolatile memory device.

The error correction circuit 230 may generate an error correction code during a program operation and may restore data using the error correction code during a read operation. That is, the error correction circuit 230 may generate an error correction code for correcting a fail-bit or an error-bit of data received from a nonvolatile memory device. Also, the error correction circuit 230 may generate data to which parity bits may be added by performing error correction encoding on data provided to the nonvolatile memory device. Parity bits may be stored in the nonvolatile memory device.

The error correction circuit 230 may perform error correction decoding on data output from a nonvolatile memory device. The error correction circuit 230 may correct errors using parity bits. The error correction circuit 230 may correct an error using a low density parity check (LDPC) code, BCH code, turbo code, Reed-Solomon code, convolution code, recursive systematic code (RSC), or coded modulation such as trellis-coded modulation (TCM), or block coded modulation (BCM). In a case that error correction is not performed in the error correction circuit 230 (e.g., error correction is not possible), a read retry operation may be performed.

The packet manager may generate a packet according to protocol of an interface negotiated with the host, or may parse various data from a packet received from the host. The encryption device may perform at least one of an encryption operation or a decryption operation on data input to the controller 22 using a symmetric-key algorithm. The encryption device may perform encryption and decryption of data using, for example, the advanced encryption standard (AES) algorithm. An encryption device may include an encryption module and a decryption module. In an example embodiment, an encryption device may be implemented in terms of hardware, software, firmware, or a combination thereof. The encryption device may perform a self-encryption disk (SED) function or a trusted computing group (TCG) security function. The SED function may store encrypted data in a nonvolatile memory device using an encryption algorithm or decrypt encrypted data from a nonvolatile memory device. The encryption/decryption operation may be performed using an internally generated encryption key. The TCG security function may provide a mechanism enabling access control to user data of the storage device 20. For example, the TCG security function may perform an authentication procedure between an external device and the storage device 20. In an example embodiment, the SED function or TCG security function may be optionally selected.

The host DMA circuit 240 (Host DMA) may be implemented to control a DMA operation between the host device and the controller 22. The host DMA circuit 240 may perform an operation of storing data input from a host device through the host interface circuit 201 in the buffer memory 220 during a program operation under control of a host controller. The host DMA circuit 240 may perform an operation of outputting data stored in the buffer memory 220 to a host device through the host interface circuit 201 during a read operation. In an example embodiment, the host DMA circuit 240 may be implemented to be included in the host controller as a component of the host controller.

The nonvolatile memory DMA circuit 250 (NVM DMA) may be implemented to control a DMA operation between the controller 22 and the nonvolatile memory device. The nonvolatile memory DMA circuit 250 may perform an operation of outputting data stored in the buffer memory 220 to a nonvolatile memory device through the nonvolatile memory interface circuit 202 during a program operation under control of a nonvolatile memory controller. The nonvolatile memory DMA circuit 250 may perform an operation of reading data stored in a nonvolatile memory device through the nonvolatile memory interface circuit 202 during a read operation.

The nonvolatile memory device according to an example embodiment may be implemented as a vertical memory device.

Figure 17:
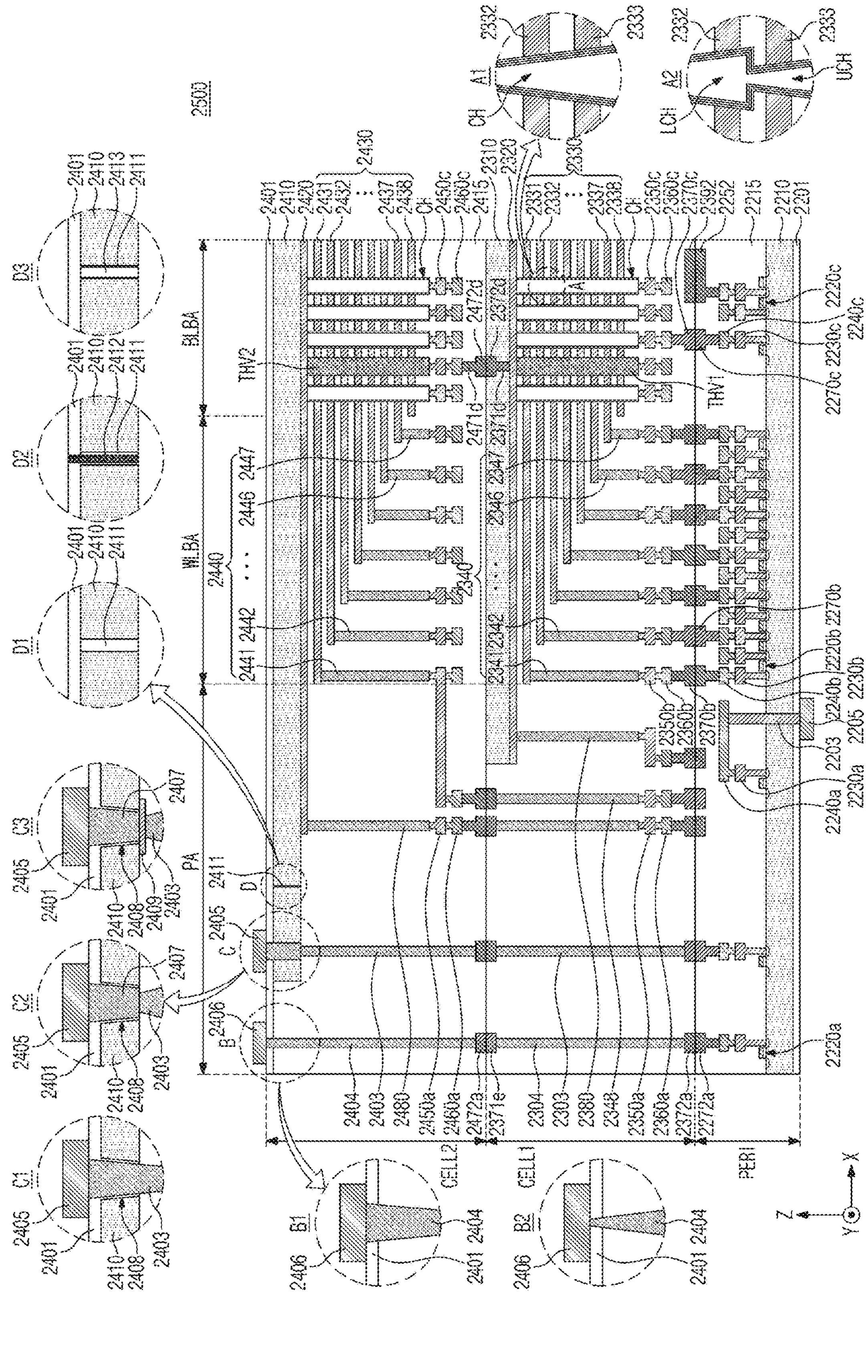
FIG. 17 is a diagram illustrating a vertical nonvolatile memory device according to an example embodiment of the present disclosure.

FIG. 17 is a diagram illustrating a vertical nonvolatile memory device according to an example embodiment. Referring to FIG. 17, a nonvolatile memory device 2500 may have a chip-to-chip (C2C) structure. Here, the C2C structure may include manufacturing at least one upper chip including a cell region CELL and a lower chip including a peripheral circuit region PERI, respectively, and connecting at least one upper chip and a lower chip to each other (e.g., by bonding). In an example embodiment, the bonding method may refer to a method of electrically or physically connecting the bonding metal pattern disposed on an uppermost metal layer of the upper chip to the bonding metal pattern disposed on an uppermost metal layer of the lower chip. For example, when the bonding metal patterns are formed of copper (Cu), the bonding method may be a Cu—Cu bonding method. In another example embodiment, bonding metal patterns may also be formed of aluminum (Al) or tungsten (W).

The nonvolatile memory device 2500 may include at least one upper chip including a cell region. For example, as illustrated in FIG. 17, a nonvolatile memory device 2500 may be implemented to include two upper chips. However, this is merely an example, and the number of upper chips is not limited thereto. When the nonvolatile memory device 2500 is implemented to include two upper chips, the nonvolatile memory device 2500 may be manufactured by manufacturing a first upper chip including a first cell region CELL1, a second upper chip including a second cell region CELL2 and a lower chip including a peripheral circuit region PERI, respectively, and connecting the first upper chip, the second upper chip and the lower chip to each other by bonding. The first upper chip may be inverted and connected to the lower chip by bonding, and the second upper chip may also be inverted and connected to the first upper chip by bonding. In the description provided herein, the upper portion and the lower portion of the first and second upper chips may be defined with respect to the state before the first upper chip and the second upper chip are inverted. That is, in FIG. 17, the upper portion of the lower chip may refer to the upper portion defined in the +Z-axis direction, and the upper portion of each of the first and second upper chips may refer to the upper portion defined in the −Z-axis direction. However, this is merely an example, and one of the first upper chip or the second upper chip may be inverted and connected to each other by bonding.

Each of the peripheral circuit region PERI and the first cell region CELL1 and the second cell region CELL2 of the nonvolatile memory device 2500 may include an external pad bonding region PA, a wordline bonding region WLBA, and a bitline bonding region BLBA.

The peripheral circuit region PERI may include a first board 2210 and a plurality of circuit devices 2220*a*, 2220*b*, and 2220*c* disposed on the first board 2210. An interlayer insulating layer 2215 including one or more insulating layers may be provided on the plurality of circuit devices 2220*a*, 2220*b*, and 2220*c*, and a plurality of metal wirings may be provided in the interlayer insulating layer 2215 to connect the plurality of circuit devices 2220*a*, 2220*b*, and 2220*c*. For example, the plurality of metal wirings may include first metal wirings 2230*a*, 2230*b*, and 2230*c* connected to a plurality of circuit devices 2220*a*, 2220*b*, and 2220*c*, and second metal wirings 2240*a*, 2240*b*, and 2240*c* disposed on first metal wirings 2230*a*, 2230*b*, and 2230*c*. The plurality of metal wirings may be formed of at least one of various conductive materials. For example, the first metal wirings 2230*a*, 2230*b*, and 2230*c* may be formed of tungsten having relatively high electrical resistivity, and the second metal wirings 2240*a*, 2240*b*, and 2240*c* may be formed of copper having relatively low electrical resistivity.

Here, the first metal wiring 2230*a*, 2230*b*, and 2230*c* and the second metal wiring 2240*a*, 2240*b*, and 2240*c* are described, but example embodiments thereof are not limited thereto, and at least one additional metal wiring may be further disposed on the second metal wirings 2240*a*, 2240*b*, and 2240*c*. In this case, the second metal wirings 2240*a*, 2240*b*, and 2240*c* may be formed of aluminum. Also, at least a portion of the additional metal wiring disposed on the second metal wirings 2240*a*, 2240*b*, and 2240*c* may be formed of copper having lower electrical resistivity than that of aluminum of the second metal wirings 2240*a*, 2240*b*, and 2240*c*.

The interlayer insulating layer 2215 may be disposed on the first board 2210 and may include an insulating material such as silicon oxide or silicon nitride.

Each of the first and second cell regions CELL1 and CELL2 may include at least one memory block. The first cell region CELL1 may include a second board 2310 and a common source line 2320. On the second board 2310, a plurality of wordlines 2331 to 2338 (2330) may be stacked in the direction (Z-axis direction) perpendicular to the upper surface of the second board 2310. String select lines and ground select lines may be disposed on the wordlines 2330. For example, the string selection lines and ground selection lines may be disposed above and below the wordlines 2330. A plurality of wordlines 2330 may be disposed between the string select lines and the ground select line. Similarly, the second cell region CELL2 may include a third board 2410 and a common source line (2420), and a plurality of wordlines 2431 to 2438 (2430) may be stacked in a direction (Z-axis direction) perpendicular to the upper surface of the third board 2410. The second board 2310 and the third board 2410 may be formed of various materials, for example, a board having a single crystal epitaxial layer grown on a silicon board, a silicon-a germanium board, a germanium board, or a monocrystalline silicon board. A plurality of channel structures CHs may be disposed in each of the first and second cell regions CELL1 and CELL2.

As illustrated in an example embodiment, in region A1, the channel structure CH may be provided in the bitline bonding region BLBA. The channel structure CH may extend in a direction perpendicular to the upper surface of the second board 2310 and may penetrate through the wordlines 2330, string select lines, and ground select lines. The channel structure CH may include a data storage layer, a channel layer, and a buried insulating layer. The channel layer may be electrically connected to the first metal wiring 2350*c* and the second metal wiring 2360*c* in a bitline bonding region BLBA. For example, the second metal wiring 2360*c* may be a bitline and may be connected to the channel structure CH through the first metal wiring 2350*c*. The second metal wiring 2360*c* (bitline) may extend in a first direction (Y-axis direction) parallel to the upper surface of the second board 2310.

In an example embodiment, as illustrated in region A2, the channel structure CH may include a lower channel LCH and an upper channel UCH connected to each other. The channel structure CH may be formed through a process for a lower channel LCH and a process for an upper channel UCH. The lower channel LCH may extend in a direction perpendicular to the upper surface of the second board 2310 and may penetrate through the common source line 2320 and the lower wordlines 2331 and 2332. The lower channel LCH may include a data storage layer, a channel layer and a buried insulating layer, and may be connected to an upper channel UCH. The upper channel UCH may penetrate through upper wordlines 2333-2338. The upper channel UCH may include a data storage layer, a channel layer and a buried insulating layer, and the channel layer of the upper channel UCH may be electrically connected to the first metal wiring 2350*c* and the second metal wiring 2360*c*. As the length of the channel increases, it may be difficult to form a channel having a constant width. The nonvolatile memory device 2500 according to an example embodiment may include a channel having improved width uniformity through a lower channel LCH and an upper channel UCH formed through sequential processes.

As illustrated in region A2, when the channel structure CH is formed to include a lower channel LCH and an upper channel UCH, a wordline disposed adjacent to the boundary of the lower channel LCH and the upper channel UCH may be a dummy wordline. For example, the wordline 2332 and the wordline 2333 forming the boundary between the lower channel LCH and the upper channel UCH may be dummy wordlines. In this case, data may not be stored in the memory cells connected to the dummy wordline. Alternatively, the number of pages corresponding to memory cells connected to a dummy wordline may be less than the number of pages corresponding to memory cells connected to a general wordline. The voltage level applied to the dummy wordline may be different from the voltage level applied to the general wordline, and accordingly, the effect of the non-uniform channel width between the lower channel LCH and the upper channel UCH on the operation of the memory device may be reduced.

Referring to region A2, the number of lower wordlines 2331 and 2332 through which the lower channel LCH penetrates may be less than the number of upper wordlines 2333-2338 through which the upper channel UCH penetrates. However, this is merely an example, and an example embodiment thereof is not limited thereto. In another example embodiment, the number of lower wordlines penetrating through the lower channel LCH may be equal to or greater than the number of upper wordlines penetrating through the upper channel UCH. Also, the structure and connection relationship of the channel structure CH disposed in the first cell region CELL1 described herein may be applied to the channel structure CH disposed in the second cell region CELL2.

In the bitline bonding region BLBA, a first through-electrode THV1 may be provided in a first cell region CELL1, and a second through-electrode THV2 may be provided in a second cell region CELL2. As illustrated in FIG. 9, a first through-electrode THV1 may penetrate through a common source line 2320 and a plurality of wordlines 2330. However, this is merely an example, and the first through-electrode THV1 may further penetrate through the second board 2310. The first through-electrode THV1 may include a conductive material. The first through-electrode THV1 may include a conductive material surrounded by an insulating material. The second through-electrode THV2 may also be provided in the same form and structure as those of the first through-electrode THV1.

In an example embodiment, the first through-electrode THV1 and the second through-electrode THV2 may be electrically connected through a first through-metal pattern 2372*d* and a second through-metal pattern 2472*d*. For example, the first through-electrode THV1 may be stacked on the second through-electrode THV2, and the first through-metal pattern 2372*d* and the second through-metal pattern 2472*d* may be stacked therebetween. The first through-metal pattern 2372*d* may be disposed on the lower end portion of the first upper chip including the first cell region CELL1, and the second through-metal pattern 2472*d* may be disposed on the upper end portion of the second upper chip including the second cell region CELL2. The first through-electrode THV1 may be electrically connected to the first metal wiring 2350*c* and the second metal wiring 2360*c*. A lower via 2371*d* may be disposed between the first through-electrode THV1 and the first through-metal pattern 2372*d*, and an upper via 2471*d* may be disposed between the second through-electrode THV2 and the second through-metal pattern 2472*d*. The first through-metal pattern 2372*d* and the second through-metal pattern 2472*d* may be connected to each other by bonding.

Also, in the bitline bonding region BLBA, an upper metal pattern 2252 may be disposed on the uppermost metal layer of the peripheral circuit region PERI, and an upper metal pattern 2392 having the same shape as that of the upper metal pattern 2252 may be disposed in the uppermost metal layer of the first cell region CELL1. The upper metal pattern 2392 of the first cell region CELL1 and the upper metal pattern 2252 of the peripheral circuit region PERI may be electrically connected to each other by bonding. In the bitline bonding region BLBA, the second metal wiring 2360*c* (bitline) may be electrically connected to a page buffer included in the peripheral circuit region PERI. For example, a portion of the circuit devices 2220*c* of the peripheral circuit region PERI may provide a page buffer, and the second metal wiring 2360*c* (bitline) may be electrically connected to circuit devices 2220*c* providing a page buffer through the upper bonding metal 2370*c* of the first cell region CELL1 and the upper bonding metal 2270*c* of the peripheral circuit region PERI.

In an example embodiment, the page buffer may be implemented to perform a 3-state latch operation as described in FIGS. 1 to 16. Although not illustrated in FIG. 17, a page buffer controller (see 152 in FIG. 1) configured to control the page buffer described in FIGS. 1 to 16 may be further disposed in the bit line bonding area (BLBA). For example, the page buffer controller may control each page buffer based on different control timings.

Referring to FIG. 17, in the wordline bonding region WLBA, the wordlines 2330 of the first cell region CELL1 may extend in a second direction (X-axis direction) parallel to the upper surface of the second board 2310 and may be connected to a plurality of cell contact plugs 2341-2347 (2340). A first metal wiring 2350*b* and a second metal wiring 2360*b* may be connected in sequence to an upper portion of the cell contact plugs 2340, which may be connected to the wordlines 2330. The cell contact plugs 2340 may be connected to the peripheral circuit region PERI through the upper bonding metal 2370*b* of the first cell region CELL1 and the upper bonding metal 2270*b* of the peripheral circuit region PERI in the wordline bonding region WLBA.

The cell contact plugs 2340 may be electrically connected to a row decoder disposed in a peripheral circuit region PERI. For example, a portion of the circuit devices 2220*b* of the peripheral circuit region PERI may provide a row decoder, and the cell contact plugs 2340 may be electrically connected to the circuit devices 2220*b* providing the row decoder through the upper bonding metal 2370*b* of the first cell region CELL1 and the upper bonding metal 2270*b* of the peripheral circuit region PERI. In an example embodiment, an operation voltage of the circuit devices 2220*b* providing a row decoder may be different from an operation voltage of the circuit devices 2220*c* providing a page buffer. For example, an operation voltage of the circuit devices 2220*c* providing a page buffer may be greater than an operation voltage of the circuit devices 2220*b* providing a row decoder.

Similarly, in the wordline bonding region WLBA, the wordlines 2430 of the second cell region CELL2 may extend in the second direction (X-axis direction) parallel to the upper surface of the third board 2410. The wordlines 2430 of the second cell region CELL2 may be connected to a plurality of cell contact plugs 2440 (2441-2447). The cell contact plugs 2440 may be connected to the peripheral circuit region PERI through an upper metal pattern of the second cell region CELL2, a lower metal pattern and an upper metal pattern of the first cell region CELL1, and a cell contact plug 2348.

In the wordline bonding region WLBA, an upper bonding metal 2370*b* may be disposed in a first cell region CELL1, and an upper bonding metal 2270*b* may be disposed in a peripheral circuit region PERI. The upper bonding metal 2370*b* of the first cell region CELL1 and the upper bonding metal 2270*b* of the peripheral circuit region PERI may be electrically connected to each other, for example, by bonding. The upper bonding metal 2370*b* and the upper bonding metal 2270*b* may be formed of aluminum, copper, or tungsten.

In the external pad bonding region PA, a lower metal pattern 2371*e* may be disposed in the lower portion of the first cell region CELL1, and an upper metal pattern (2472*a*) may be disposed in the upper portion of the second cell region CELL2. The lower metal pattern 2371*e* of the first cell region CELL1 and the upper metal pattern 2472*a* of the second cell region CELL2 may be connected to each other by bonding in the external pad bonding region PA. Similarly, an upper metal pattern 2372*a* may be disposed on the first cell region CELL1, and an upper metal pattern 2272*a* may be disposed on the peripheral circuit region PERT. The upper metal pattern 2372*a* of the first cell region CELL1 and the upper metal pattern 2272*a* of the peripheral circuit region PERI may be connected to each other, for example, by bonding.

Common source line contact plugs 2380 and 2480 may be disposed in the external pad bonding region PA. The common source line contact plugs 2380 and 2480 may be formed of a conductive material such as metal, metal compound, or doped polysilicon. The common source line contact plug 2380 of the first cell region CELL1 may be electrically connected to the common source line 2320, and the common source line contact plug 2480 of the second cell region CELL2 may be electrically connected to the common source line 2420. A first metal wiring 2350*a* and a second metal wiring (2360*a*) may be stacked in sequence on the common source line contact plug 2380 of the first cell region CELL1, and a first metal wiring 2450*a* and a second metal wiring 2460*a* may be stacked in sequence on the common source line contact plug 2480 of the second cell region CELL2.

The input/output pads 2205, 2405, and 2406 may be disposed in the external pad bonding region PA. Referring to FIG. 17, a lower insulating film 2201 may cover the lower surface of the first board 2210, and a first input/output pad 2205 may be disposed on the lower insulating film 2201. The first input/output pad 2205 may be connected to at least one of the plurality of circuit devices 2220*a* disposed in the peripheral circuit region PERI through the first input/output contact plug 2203 and may be isolated from the first board 2210 by a lower insulating film 2201. Also, a side insulating film may be disposed between the first input/output contact plug 2203 and the first board 2210 and may electrically isolate the first input/output contact plug 2203 and the first board 2210 from each other.

An upper insulating film 2401 covering an upper surface of the third board 2410 may be formed above the third board 2410. A second input/output pad 2405 or a third input/output pad 2406 may be disposed on the upper insulating film 2401. The second input/output pad 2405 may be connected to at least one of a plurality of circuit devices 2220*a* disposed in the peripheral circuit region PERI through the second input/output contact plugs 2403 and 2303, and the third input/output pad 2406 may be connected to at least one of the plurality of circuit devices 2220*a* arranged in the peripheral circuit region PERI through the third input/output contact plugs 2404 and 2304.

In an example embodiment, the third board 2410 may not be disposed in a region in which an input/output contact plug is disposed. For example, as illustrated in B, the third input/output contact plug 2404 may be isolated from the third board 2410 in a direction parallel to the upper surface of the third board 2410, and may penetrate through the interlayer insulating layer 2415 of the second cell region CELL2 and may be connected to the third input/output pad 2406. In this case, the third input/output contact plug 2404 may be formed through various processes.

For example, as illustrated in region B1, the third input/output contact plug 2404 may extend in the third direction (Z-axis direction) and may have a diameter increasing toward the upper insulating film 2401. That is, while the diameter of the channel structure CH described in region A1 is formed to decrease toward the upper insulating film 2401, the diameter of the third input/output contact plug 2404 may increase toward the upper insulating film 2401. For example, the third input/output contact plug 2404 may be formed after the second cell region CELL2 and the first cell region CELL1 are bonded to each other.

Also, as an example, as illustrated in region B2, the third input/output contact plug 2404 may extend in the third direction (Z-axis direction) and may have a diameter decreasing toward the upper insulating film 2401. That is, the diameter of the third input/output contact plug 2404 may decrease toward the upper insulating film 2401 similarly to the channel structure CH. For example, the third input/output contact plug 2404 may be formed together with the cell contact plugs 2440 before the second cell region CELL2 and the first cell region CELL1 are bonded to each other.

In another example embodiment, an input/output contact plug may be disposed to overlap the third board 2410. For example, as illustrated in region C, the second input/output contact plug 2403 may penetrate through the interlayer insulating layer 2415 of the second cell region CELL2 in the third direction (Z-axis direction), and may be electrically connected to the second input/output pad 2405 through the third board 2410. In this case, the connection structure of the second input/output contact plug 2403 and the second input/output pad 2405 may be implemented in various manners.

For example, as illustrated in region C1, an opening 2408 penetrating through the third board 2410 may be formed, and the second input/output contact plug 2403 may be directly connected to the second input/output pad 2405 through an opening 2408 disposed in the third board 2410. In this case, as illustrated in region C1, the diameter of the second input/output contact plug 2403 may increase toward the second input/output pad 2405. However, this is merely an example, and the diameter of the second input/output contact plug 2403 may decrease toward the second input/output pad 2405.

For example, as illustrated in region C2, an opening 2408 penetrating through the third board 2410 may be formed, and a contact 2407 may be disposed in the opening 2408. A first end portion of the contact 2407 may be connected to the second input/output pad 2405, and a second end portion may be connected to the second input/output contact plug 2403. Accordingly, the second input/output contact plug 2403 may be electrically connected to the second input/output pad 2405 through the contact 2407 in the opening 2408. In this case, as illustrated in region C2, the diameter of the contact 2407 may increase toward the second input/output pad 2405, and the diameter of the second input/output contact plug 2403 may decrease toward the second input/output pad 2405. For example, the third input/output contact plug 2403 may be formed together with the cell contact plugs 2440 before the second cell region CELL2 and the first cell region CELL1 are bonded to each other, and the contact 2407 may be formed after the second cell region CELL2 and the first cell region CELL1 are bonded to each other.

Also, as an example, as illustrated in region C3, a stopper 2409 may be further disposed on the upper surface of the opening 2408 of the third board 2410 as compared to C2. The stopper 2409 may be metal wiring disposed on the same layer as the common source line 2420. However, this is merely an example, and the stopper 2409 may be metal wiring disposed on the same layer as at least one of the wordlines 2430. The second input/output contact plug 2403 may be electrically connected to the second input/output pad 2405 through the contact 2407 and the stopper 2409.

Similarly to the second and third input/output contact plugs 2403 and 2404 of the second cell region CELL2, the second and third input/output contact plugs 2303 and 2304 of the first cell region CELL1 may have a diameter decreasing toward the lower metal pattern **2371*e* or a diameter increasing toward the lower metal pattern 2371*e***, respectively.

In example embodiments, a slit 411 may be disposed on the third board 2410. For example, the slit 2411 may be disposed in an arbitrary position of the external pad bonding region PA. In an example embodiment, as illustrated D, the slit 2411 may be disposed between the second input/output pad 2405 and the cell contact plugs 2440 when viewed from a plane. However, this is merely an example, and the slit 2411 may be formed such that the second input/output pad 2405 may be disposed between the slit 2411 and the cell contact plugs 2440 when viewed from a plane.

For example, as illustrated in region D1, the slit 2411 may be formed to penetrate through the third board 2410. The slit 2411 may be used to prevent the third board 2410 from being finely split when the opening 2408 is formed. However, this is merely an example, and the slit 2411 may be formed to a depth of about 60-70% of the thickness of the third board 2410.

Also, as an example, as illustrated in region D2, a conductive material 2412 may be disposed in the slit 2411. The conductive material 2412 may be used, for example, to discharge leakage current generated during driving of circuit devices in an external pad bonding region PA. In this case, the conductive material 2412 may be connected to an external ground line.

As an example, as illustrated in region D3, an insulating material 2413 may be disposed in the slit 2411. The insulating material 2413 may electrically isolate the second input/output pad 2405 and the second input/output contact plug 2403 disposed in the external pad bonding region PA from the wordline bonding region WLBA, for example. By forming the insulating material 2413 in the slit 2411, the voltage provided through the second input/output pad 2405 may be prevented from affecting the metal layer disposed on the third board 2410 in the wordline bonding region WLBA.

In example embodiments, first to third input/output pads 2205, 2405, and 2406 may be selectively formed. For example, the nonvolatile memory device 2500 may include only the first input/output pad 2205 disposed on the first board 2210, may include the second input/output pad 2405 disposed on the third board 2410, or may include only the third input/output pad 2406 disposed on the upper insulating film 2401.

In example embodiments, at least one of the second board 2310 of the first cell region CELL1 and the third board 2410 of the second cell region CELL2 may be used as a sacrificial board, and may be completely or partially removed before or after the bonding process. An additional film may be deposited after removing the board. For example, the second board 2310 of the first cell region CELL1 may be removed before or after bonding between the peripheral circuit region PERI and the first cell region CELL1, and an insulating film covering the upper surface of the common source line 2320 or a conductive film for connection may be formed. Similarly, the third board 2410 of the second cell region CELL2 may be removed before or after bonding between the first cell region CELL1 and the second cell region CELL2, and an upper insulating film 2401 covering the upper surface of the common source line 2420 or a conductive film for connection may be formed.

The device described herein may be implemented with hardware components, software components, and/or a combination of hardware components and software components. For example, the device and components described in an example embodiment may be implemented using one or more general-purpose or special-purpose computers such as a processor, a controller, an arithmetic logic unit (ALU), a digital signal processor, a microcomputer, a field programmable gate array (FPGA), and a programmable logic unit (PLU), a microprocessor, or any other device which may execute instructions and respond. A processing device may execute an operating system (OS) and one or more software applications running on the operating system. Also, a processing device may access, store, manipulate, process and generate data in response to the execution of software. For ease of description, a single processing device may be used, but the processing device may include a plurality of processing elements or a plurality of types of processing elements. For example, a processing device may include a plurality of processors or a processor and a controller. Also, other processing configurations, such as parallel processors, may be possible.

Software may include a computer program, codes, instructions, or a combination of one or more thereof, and may configure the processing device to operate as desired or to instruct the processing device independently or collectively. Software and/or data may be embodied in any type of machine, component, physical device, virtual equipment, computer storage medium or device to be interpreted by or to provide instructions or data to a processing device. Software may be distributed over networked computer systems and may be stored or executed in a distributed manner. Software and data may be stored on one or more computer-readable recording media.

The nonvolatile memory interface circuit and the method of operating the same according to an example embodiment may collect margin information by comparing data read in the margin collection logic with captured data, may track the SI margin (e.g., an improved or optimal SI margin) by adjusting an offset based on margin information in the margin lock detection logic, and the compensation calculation logic may determine the amount of off-chip variation in the SI margin and compensate according to the offset value.

The nonvolatile memory interface circuit in an example embodiment may include a margin collection logic configured to receive captured data and user data, a margin valid search logic configured to receive margin information generated by margin collection logic and including a feedback loop for a margin lock, and a compensation calculation logic configured to receive margin information and configured to determine the amount of off-chip variation when the margin lock state is reached in the margin valid search logic. The captured data may be captured through sampling DQS, and the number of sampling DQS may be two or more.

According to example embodiments, since the circuit is mostly controllable internally in hardware (HW), the circuit may be applied through SFR settings at the HW initialization stage, and may also be applied to a nonvolatile memory device and also to portions interfacing with other memories.

Also, in example embodiments, the left edge and the right edge may be tracked based on the number of errors, and a compensation may be performed by arbitrarily adjusting the timing of DQ and DQS during runtime. Even in a case where the timing of DQ and DQS has been adjusted to exceed the valid window margin, the read path may operate normally.

While example embodiments have been illustrated and described above, it will be configured as apparent to those skilled in the art that modifications and variations could be made without departing from the scope of the present disclosure as defined by the appended claims.

What is claimed is:

1. A nonvolatile memory interface circuit comprising:

a main path circuit configured to capture a data signal using a data strobe signal delayed based on offset information, and to output read data based on the data signal;

a first capture path circuit configured to generate a plurality of first sampling data strobe signals by delaying the data strobe signal using first offset information, and to capture the data signal in response to each first sampling data strobe signal of the plurality of first sampling data strobe signals to output first sampling data;

a second capture path circuit configured to generate a plurality of second sampling data strobe signals by delaying the data strobe signal using second offset information, and to capture the data signal in response to each second sampling data strobe signal of the plurality of second sampling data strobe signals to output second sampling data; and an off-chip compensation logic configured to determine a first error count between the read data and the first sampling data, and determine a second error count between the read data and the second sampling data, and to correct the offset information, the first offset information, and the second offset information using the first error count and the second error count.

2. The nonvolatile memory interface circuit of claim 1, wherein the plurality of first sampling data strobe signals and the plurality of second sampling data strobe signals each number at least three.

3. The nonvolatile memory interface circuit of claim 1, wherein the main path circuit includes:

a delay line configured to receive the data strobe signal and to delay the data strobe signal based on the offset information; and an output circuit configured to sample the data signal in response to the data strobe signal delayed based on the offset information.

4. The nonvolatile memory interface circuit of claim 1, wherein the first capture path circuit includes:

a first delay line configured to receive the data strobe signal, and to output the plurality of first sampling data strobe signals by delaying the data strobe signal based on the first offset information; and a plurality of first output circuits configured to sample the data signal in response to each first sampling data strobe signal of the plurality of first sampling data strobe signals.

5. The nonvolatile memory interface circuit of claim 4, wherein the second capture path circuit includes:

a second delay line configured to receive the data strobe signal, and to output the plurality of second sampling data strobe signals by delaying the data strobe signal based on the second offset information; and a plurality of second output circuits configured to sample the data signal in response to each second sampling data strobe signal of the plurality of second sampling data strobe signals.

6. The nonvolatile memory interface circuit of claim 1, wherein the off-chip compensation logic includes:

a margin collector configured to generate the first error count by comparing the read data with the first sampling data, and to generate the second error count by comparing the read data with the second sampling data;

an on-chip margin search logic configured to control the first offset information using the first error count and to control the second offset information using the second error count; and a compensation calculator configured to determine an off-chip variation offset using the first offset information and the second offset information in a margin lock state of a valid window to correct the offset information.

7. The nonvolatile memory interface circuit of claim 6, wherein the margin collector counts a number of errors by an XOR computation of the read data and the first sampling data or an XOR computation of the read data and the second sampling data.

8. The nonvolatile memory interface circuit of claim 6, wherein the on-chip margin search logic controls the first offset information and the second offset information to enter the margin lock state.

9. The nonvolatile memory interface circuit of claim 6, wherein the off-chip variation offset is used to correct a write data strobe signal of a write path.

10. The nonvolatile memory interface circuit of claim 3, further comprising:

a DQ training logic configured to perform a training operation on data signals during power-up; and an on-chip compensation logic configured to compensate an offset of the delay line according to a fixed value in a delay line loop in real time.

11. A nonvolatile memory interface circuit comprising:

a first delay line configured to receive a data signal and output a delayed data signal;

a second delay line configured to receive a data strobe signal and output a plurality of sampling data strobe signals by delaying the data strobe signal;

an output circuit configured to output the delayed data signal as read data in response to the data strobe signal; and an off-chip compensation logic configured to detect off-chip variation in real time by comparing the read data with sampling data corresponding to the plurality of sampling data strobe signals, and to compensate for the off-chip variation.

12. The nonvolatile memory interface circuit of claim 11, wherein the off-chip compensation logic counts a number of errors corresponding to the plurality of sampling data strobe signals, respectively, after a read direct memory access, to search for an on-chip margin according to the number of errors and to compensate for the on-chip margin in a read path of the read data.

13. The nonvolatile memory interface circuit of claim 12, wherein the off-chip compensation logic applies a valid window margin to a write path using the off-chip variation in a margin lock state.

14. The nonvolatile memory interface circuit of claim 12, wherein the off-chip compensation logic includes:

a margin collector configured to determine the number of errors for each offset by performing an XOR computation on the read data and the sampling data corresponding to the plurality of sampling data strobe signals;

an on-chip margin search logic configured to search for a valid window margin using the number of errors; and a compensation calculator configured to determine the off-chip variation using offset information corresponding to the valid window margin when the valid window margin is in a margin lock state.

15. The nonvolatile memory interface circuit of claim 14, wherein the off-chip variation is used for at least one of chip health monitoring or telemetry.

16. A storage device comprising:

at least one nonvolatile memory device; and a controller configured to control the at least one nonvolatile memory device, wherein the controller includes a nonvolatile memory interface circuit configured to communicate with the at least one nonvolatile memory device through at least one channel, wherein the nonvolatile memory interface circuit includes:

a margin collector configured to collect margin information by comparing read data with sampling data;

an on-chip margin search logic configured to track a valid window margin by adjusting an offset value based on the margin information; and a compensation calculator configured to determine off-chip variation corresponding to the offset value when the valid window margin is in a margin lock state.

17. The storage device of claim 16, wherein the margin collector receives the read data and the sampling data, wherein the sampling data is captured based on a plurality of sampling data strobe signals, and wherein a number of the plurality of sampling data strobe signals is at least two.

18. The storage device of claim 16, wherein the on-chip margin search logic is implemented as a feedback loop to receive the margin information from the margin collector and to allow the valid window margin to be the margin lock state.

19. The storage device of claim 18, wherein, when the valid window margin is in the margin lock state, the compensation calculator receives the margin information from the on-chip margin search logic and determines the off-chip variation corresponding to the margin information received from the on-chip margin search logic.

20. The storage device of claim 16, wherein the controller uses the off-chip variation as criteria for performing a DQ re-training.

* * * * *